(12) United States Patent
Jung et al.

(10) Patent No.: US 11,411,179 B2
(45) Date of Patent: Aug. 9, 2022

(54) VARIABLE RESISTANCE MEMORY DEVICE AND METHOD OF FABRICATING THE SAME

(71) Applicant: SAMSUNG ELECTRONICS CO., LTD., Suwon-si (KR)

(72) Inventors: Jaeho Jung, Seoul (KR); Kwangmin Park, Seoul (KR); Jonguk Kim, Yongin-si (KR); Dongsung Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 198 days.

(21) Appl. No.: 16/933,123

(22) Filed: Jul. 20, 2020

(65) Prior Publication Data
US 2021/0126194 A1    Apr. 29, 2021

(30) Foreign Application Priority Data
Oct. 25, 2019    (KR) .................. 10-2019-0133495

(51) Int. Cl.
*H01L 45/00*    (2006.01)
*H01L 27/24*    (2006.01)

(52) U.S. Cl.
CPC ...... *H01L 45/1641* (2013.01); *H01L 27/2481* (2013.01); *H01L 45/12* (2013.01); *H01L 45/1616* (2013.01); *H01L 45/1691* (2013.01)

(58) Field of Classification Search
CPC ................................................. H01L 45/1691
See application file for complete search history.

(56) References Cited

U.S. PATENT DOCUMENTS

| | | | |
|---|---|---|---|
| 8,158,966 B2 | 4/2012 | Rho et al. | |
| 9,502,646 B2 | 11/2016 | Oh et al. | |
| 9,515,250 B2 | 12/2016 | Ha | |
| 10,026,890 B2 | 7/2018 | Kim et al. | |
| 2009/0206317 A1 | 8/2009 | Kang | |
| 2010/0167480 A1 | 7/2010 | Paek | |
| 2017/0092847 A1* | 3/2017 | Kim | H01L 43/08 |
| 2017/0186607 A1 | 6/2017 | Kuo et al. | |
| 2018/0366645 A1 | 12/2018 | Campbell et al. | |
| 2019/0013357 A1 | 1/2019 | Kim et al. | |

FOREIGN PATENT DOCUMENTS

JP    5824192    10/2015

* cited by examiner

*Primary Examiner* — Moazzam Hossain
*Assistant Examiner* — Hajar Kolahdouzan
(74) *Attorney, Agent, or Firm* — F. Chau & Associates, LLC

(57) ABSTRACT

A method of fabricating a variable resistance memory device that includes forming a plurality of memory cells on a substrate. Each of the plurality of memory cells in a switching device and a variable resistance pattern. A capping structure is formed that commonly covers lateral side surfaces of the plurality of memory cells. An insulating gapfill layer is formed that covers the capping structure and fills a region between adjacent memory cells of the plurality of memory cells. The forming of the capping structure includes forming a second capping layer including silicon oxide that covers the lateral side surfaces of the plurality of memory cells. At least a partial portion of the second capping layer is nitrided by performing a first decoupled plasma process to form a third capping layer that includes silicon oxynitride.

20 Claims, 20 Drawing Sheets

VARIABLE RESISTANCE MEMORY DEVICE AND METHOD OF FABRICATING THE SAME

CROSS-REFERENCE TO RELATED APPLICATIONS

This application claims priority under 35 U.S.C. § 119 to Korean Patent Application No. 10-2019-0133495, filed on Oct. 25, 2019, in the Korean Intellectual Property Office, the disclosure of which is incorporated by reference in its entirety herein.

1. Technical Field

The present inventive concepts relate to a semiconductor, and in particular, to a variable resistance memory device and a method of fabricating the same.

2. Discussion of Related Art

Semiconductor devices are generally classified into memory devices and logic devices. Memory devices are used to store data. Semiconductor memory devices are generally classified into volatile memory devices and non-volatile memory devices. The volatile memory devices lose the data stored thereon when the power supply is interrupted. A dynamic random access memory (DRAM) device and a static random access memory (SRAM) device are examples of volatile memory devices. In contrast, nonvolatile memory devices retain the data stored thereon even when the power supply is interrupted. A programmable read only memory (PROM) device, an erasable PROM (EPROM) device, an electrically EPROM (EEPROM) device, and a flash memory device, are examples of nonvolatile memory devices.

SUMMARY

An exemplary embodiment of the present inventive concepts includes a method of preventing phase-change patterns of a variable resistance memory device from being damaged in a subsequent process and a method of reducing a process time of a high temperature process for forming a capping structure.

According to an exemplary embodiment of the present inventive concepts, a method of fabricating a variable resistance memory device includes forming a plurality of memory cells on a substrate. Each of the plurality of memory cells includes a switching device and a variable resistance pattern. A capping structure is formed that commonly covers lateral side surfaces of the plurality of memory cells. An insulating gapfill layer is formed that covers the capping structure and fills a region between adjacent memory cells of the plurality of memory cells. The forming of the capping structure includes forming a second capping layer including silicon oxide that covers the lateral side surfaces of the plurality of memory cells. At least a partial portion of the second capping layer is nitrided by performing a first decoupled plasma process to form a third capping layer that includes silicon oxynitride.

According to an exemplary embodiment of the present inventive concepts, a method of fabricating a variable resistance memory device includes forming a plurality of memory cells on a substrate. Each of the plurality of memory cells includes a switching device and a variable resistance pattern. A capping structure is formed that commonly covers lateral side surfaces of the plurality of memory cells. An insulating gapfill layer is formed that covers the capping structure and fills a region between adjacent memory cells of the plurality of memory cells. The forming of the capping structure includes forming a first capping layer including silicon nitride that covers the lateral side surfaces of the plurality of memory cells. A second capping layer is formed on the first capping layer. At least a partial portion of the second capping layer is nitrided by performing a first decoupled plasma process to form a third capping layer including silicon oxynitride. A third decoupled plasma process is performed using a process gas including helium, after the first decoupled plasma process is performed.

According to an exemplary embodiment of the present inventive concepts, a variable resistance memory device includes a plurality of memory cells disposed at intersections between first conductive lines and second conductive lines that cross each other. Each of the plurality of memory cells includes a switching device and a variable resistance pattern. A capping structure commonly covers lateral side surfaces of each memory cell of the plurality of memory cells. An insulating gapfill layer covers the capping structure and fills a region between adjacent memory cells of the plurality of memory cells. The capping structure includes a first capping layer that covers the lateral side surfaces of the plurality of memory cells. The first capping layer includes silicon nitride. A second capping layer is disposed on the first capping layer. The second capping layer includes silicon oxide. A third capping layer is disposed on the second capping layer. The third capping layer includes silicon oxynitride.

According to an exemplary embodiment of the present inventive concepts, a variable resistance memory device includes a plurality of memory cells disposed at intersections between first conductive lines and second conductive lines that cross each other. Spacer structures are disposed on lateral side surfaces of the plurality of memory cells. A capping structure commonly covers, the spacer structures of each memory cell of the plurality of memory cells. An insulating gapfill layer covers the capping structure and fills a region between adjacent memory cells of the plurality of memory cells. Each of the plurality of memory cells comprises a switching device and a variable resistance pattern. The capping structure includes a first capping layer that covers the lateral side surfaces of the memory cells. The first capping layer includes silicon nitride. A second capping layer is disposed on the first capping layer. The second capping layer includes silicon oxide. A third capping layer is disposed on the second capping layer. The third capping layer includes silicon oxynitride.

According to an exemplary embodiment of the present inventive concepts, a method of fabricating a variable resistance memory device includes forming a plurality of memory cell stacks on a substrate. Each of the plurality of memory cell stacks includes a plurality of memory cells. Each memory cell of the plurality of memory cells includes a switching device and a variable resistance pattern. The plurality of memory cells is formed by forming a capping structure that commonly covers lateral side surfaces of the plurality of memory cells using at least one decoupled plasma process. An insulating gapfill layer is formed that covers the capping structure and fills a region between adjacent memory cells of the plurality of memory cells.

BRIEF DESCRIPTION OF THE DRAWINGS

Exemplary embodiments of the present inventive concepts will be more clearly understood from the following brief description taken in conjunction with the accompanying drawings. The accompanying drawings represent non-limiting, exemplary embodiments as described herein.

It should be noted that these figures are intended to illustrate the general characteristics of methods, structure and/or materials utilized in certain exemplary embodiments and to supplement the written description provided below. These drawings are not, however, to scale and may not precisely reflect the precise structural or performance characteristics of any given exemplary embodiment, and should not be interpreted as defining or limiting the range of values or properties encompassed by exemplary embodiments. For example, the relative thicknesses and positioning of molecules, layers, regions, and/or structural, elements may be reduced or exaggerated for clarity. The use of similar or identical reference numbers in the various drawings is intended to indicate the presence of a similar or identical element or feature.

DETAILED DESCRIPTION OF EXEMPLARY EMBODIMENTS

Exemplary embodiments of the present inventive concepts will now be described more fully with reference to the accompanying drawings, in which exemplary embodiments are shown.

Figure 1:
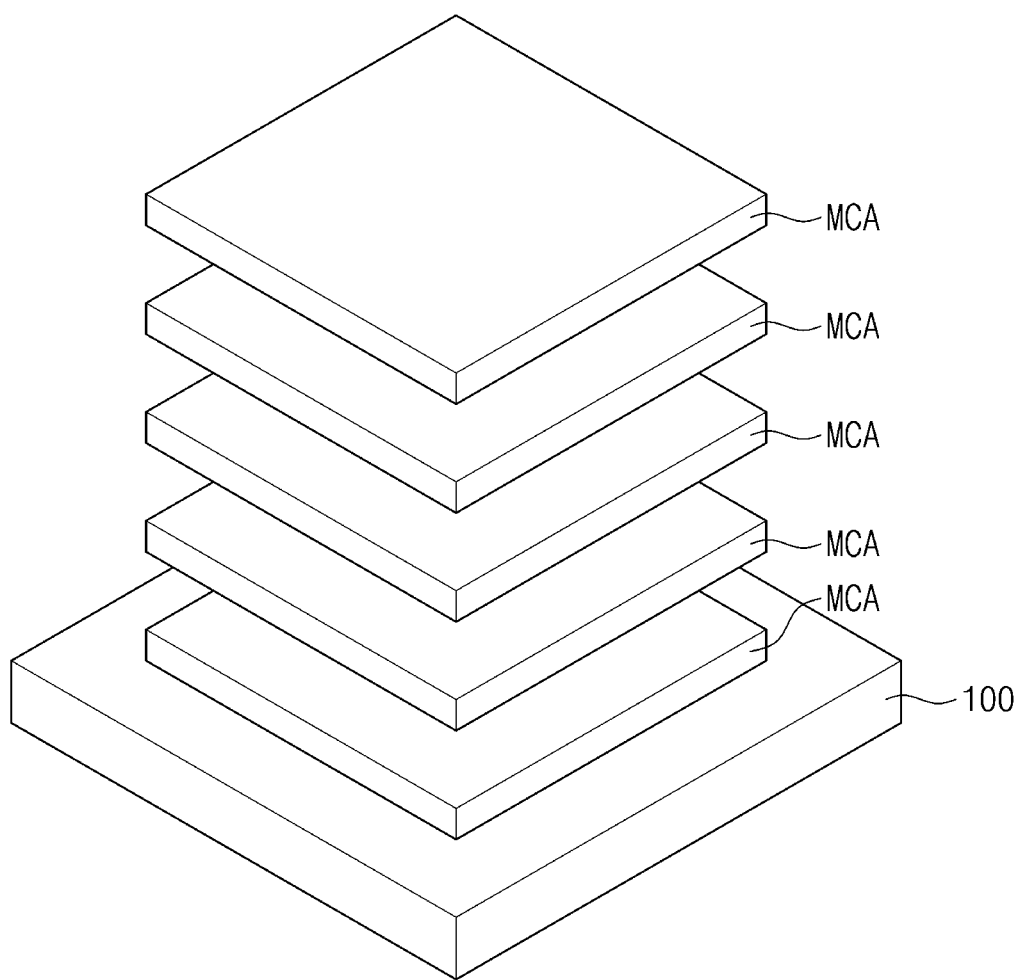
FIG. 1 is a perspective view of a variable resistance memory device according to an exemplary embodiment of the present inventive concepts.

FIG. 1 is a conceptual diagram illustrating a variable resistance memory device according to an exemplary embodiment of the present inventive concepts. Referring to the exemplary embodiment of FIG. 1, the variable resistance memory device may include a plurality of memory cell stacks MCA sequentially stacked on a substrate 100. For example, as shown in the exemplary embodiment of FIG. 1, each of the plurality of memory cell stacks MCA may be sequentially stacked in a thickness direction of the substrate 100. Each of the memory cell stacks MCA may include a plurality of variable resistance memory cells, which are two-dimensionally arranged on the substrate 100. In an exemplary embodiment, the variable resistance memory device may include a plurality of conductive lines, which are disposed between the memory cell stacks MCA and are used to perform write, read, and erase operations on the memory cells. In the exemplary embodiment of FIG. 1, the variable resistance memory device includes five memory cell stacks MCA. However, exemplary embodiments of the present inventive concepts are not limited thereto and the number of the memory cell stacks MCA of the variable resistance memory cell device may vary.

Figure 2:
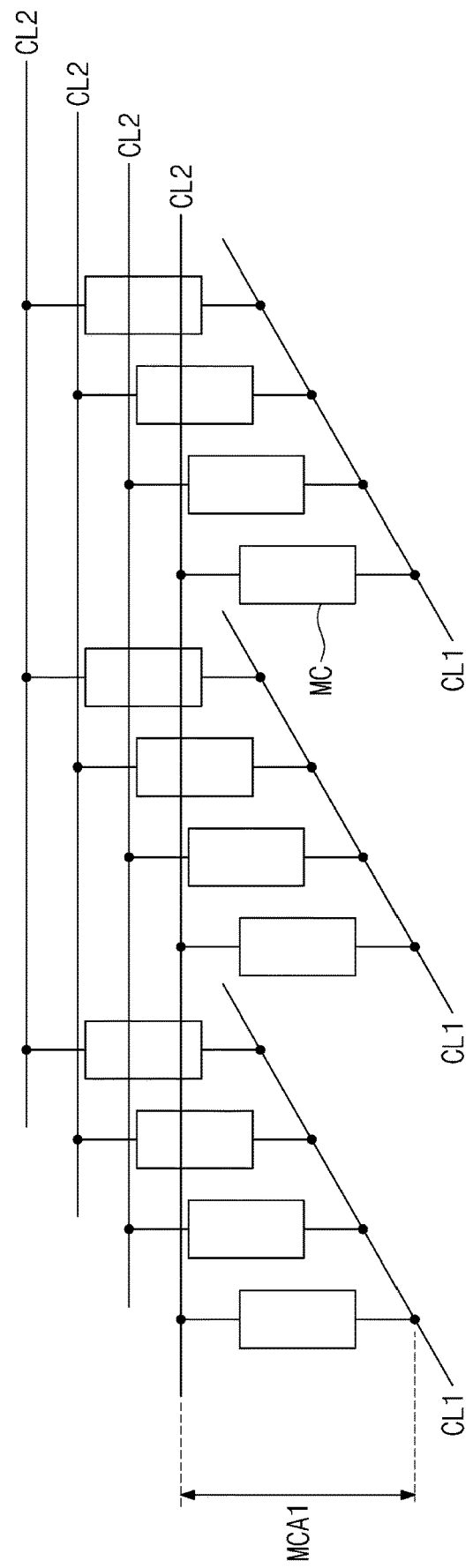
FIG. 2 is a circuit diagram of memory cell stacks of FIG. 1 according to an exemplary embodiment of the present inventive concepts.

FIG. 2 is a circuit diagram illustrating memory cell stacks of FIG. 1. FIG. 2 illustrates a first memory cell stack MCA1, which may be any one of the memory cell stacks MCA shown in the exemplary embodiment of FIG. 1. As shown in the exemplary embodiment of FIG. 2, the first memory cell stack MCA may include first conductive lines CL1, second conductive lines CL2 that cross the first conductive lines CL1, and a plurality of memory cells MC which are provided at intersection points between the first and second conductive lines CL1 and CL2. A second memory cell stack may be provided on the first memory cell stack MCA1 (e.g., in a vertical direction). The second memory cell stack may include third conductive lines, fourth conductive lines, and a plurality of memory cells that are provided at intersection points between the third and fourth conductive lines that cross each other, similar to the first memory cell stack MCA1. In an exemplary embodiment, the third conductive lines may be separate conductive lines, which are vertically spaced apart from the second conductive lines CL2. However, exemplary embodiments of the present inventive concepts are not limited thereto. For example, in other exemplary embodiments, the first memory cell stack MCA1 and the second memory cell stack may share the second conductive lines CL2. In this embodiment, the third conductive lines may correspond to the second conductive lines CL2.

The memory cells MC constituting the first memory cell stack MCA1 may be arranged on the substrate 100 to form a plurality of rows and a plurality of columns (e.g., in a two-dimensional array shape). Each of the memory cells MC may include a switching device and a variable resistance pattern. In the exemplary embodiment shown in FIG. 2 in which the first conductive lines CL1 are provided between the second conductive lines CL2 and the substrate 100, the switching device of each memory cell MC may be provided between the substrate 100 and the variable resistance pattern. However, exemplary embodiments of the present inventive concepts are not limited thereto and in certain exemplary embodiments, the variable resistance pattern may be provided between the substrate 100 and the switching device.

In an exemplary embodiment, the switching devices may be provided at respective intersection points of the first conductive lines CL1 and the second conductive lines CL2 and may be physically separated from other switching devices, which are provided at neighboring intersection points. The variable resistance patterns may be provided at respective intersection points of the first conductive lines CL1 and the second conductive lines CL2 and may be physically separated from other variable resistance patterns, which are provided at neighboring intersection points. Alternatively, a single pattern, which is composed of a plurality of physically-connected variable resistance patterns, may be shared by the plurality of memory cells MC of the first memory cell stack MCA1. When viewed in a plan view, the variable resistance pattern may be a line-shaped pattern, which is elongated in an extending direction of the first or second conductive lines CL1 or CL2.

The second conductive lines CL2 may be shared by the first memory cell stack MCA1 and other memory cell stacks disposed thereon. Alternatively, the memory cell stacks MCA may not share conductive lines (e.g., the second conductive lines CL2, etc.) and each of the memory cell stacks MCA may be configured to include its own conductive lines.

Figure 3:
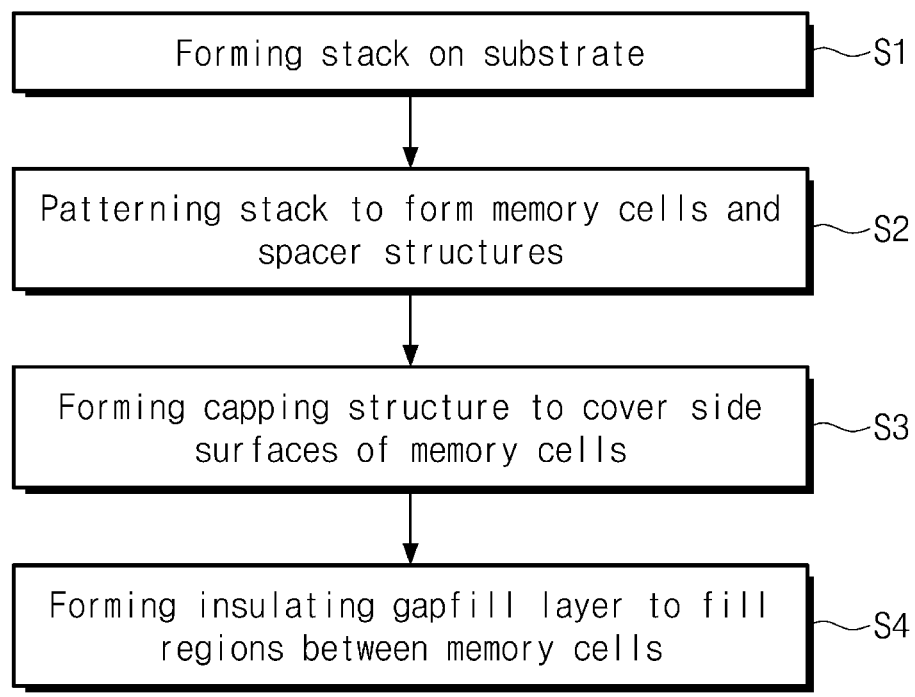
FIG. 3 is a process flow chart of a method of fabricating a variable resistance memory device according to an exemplary embodiment of the present inventive concepts.
Figure 4:
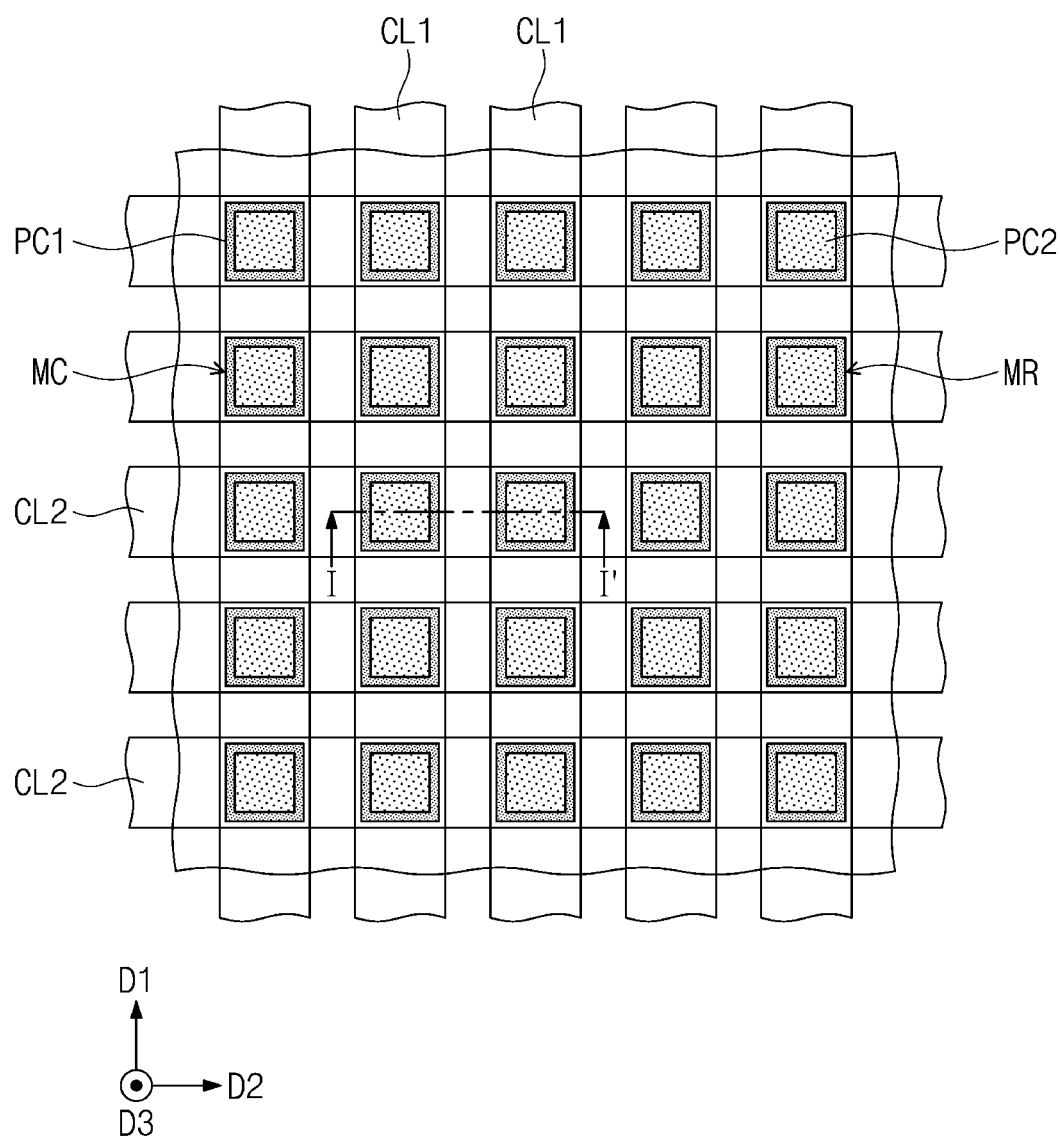
FIG. 4 is a plan view illustrating a variable resistance memory device according to an exemplary embodiment of the present inventive concepts.

FIG. 3 is a process flow chart illustrating a method of fabricating a variable resistance memory device according to an exemplary embodiment of the present inventive concepts. FIG. 4 is a plan view illustrating a variable resistance memory device according to an exemplary embodiment of the present inventive concepts. FIGS. 5 to 12 are sectional views taken along line I-I' of FIG. 4 according to exemplary embodiments of the present inventive concepts.

Figure 5:
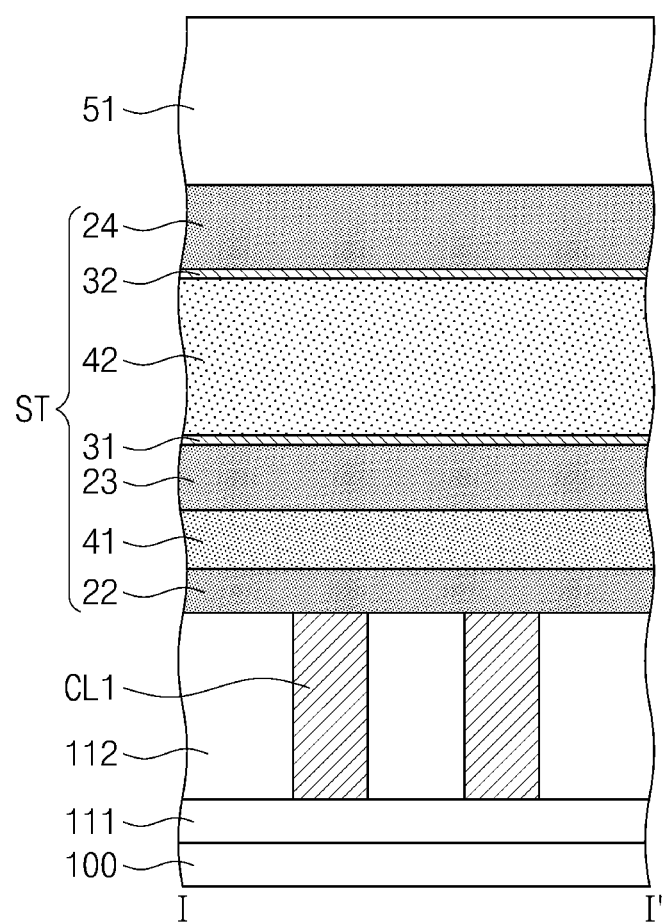
FIGS. 5 to 12 are cross-sectional views taken along line I-I' of FIG. 4 according to exemplary embodiments of the present inventive concepts.
Figure 5:
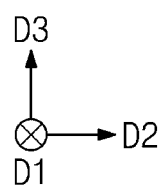

Referring to the exemplary embodiments of FIGS. 3 to 5, in block S1 a stack ST may be funned on the substrate 100. For example, first conductive lines CL1 may be formed on the substrate 100, and a stack ST may be formed on the first conductive lines CL1. A first interlayered insulating layer 111 may be disposed on the substrate 100. As shown in the exemplary embodiment of FIG. 5, a bottom surface of the first interlayered insulating layer 111 may directly contact a top surface of the substrate 100. The first conductive lines CL1 may be formed in a second interlayered insulating layer 112, which is formed on the first interlayered insulating layer 111. For example, as shown in the exemplary embodiment of FIG. 5, bottom surfaces of the first conductive lines CL1 and second interlayered insulating layer 112 may directly contact a top surface of the first interlayered insulating layer 111. The first conductive lines CL1 may extend longitudinally in the thickness direction of the substrate. In an exemplary embodiment, the formation of the first conductive lines CL1 may include forming a conductive layer on the first interlayered insulating layer 111 and patterning the conductive layer. Thereafter, an insulating layer may be formed to cover spaces between adjacent conductive lines CL1 and side and top surfaces of the conductive lines CL1, and a planarization process may be subsequently performed on the insulating layer to form the second interlayered insulating layer 112 exposing top surfaces of the first conductive lines CL1.

The first conductive lines CL1 may be formed of or include at least one of conductive materials, such as tungsten, copper, aluminum, etc. In an exemplary embodiment, the first conductive lines CL1 may further include a conductive metal nitride, such as TiN of WN. The first interlayered insulating layer 111 may be formed of or include at least one composition selected from silicon oxide, silicon nitride, and silicon oxynitride. In certain exemplary embodiments, the first conductive lines CL1 may be formed by a patterning process, which will be described below along with the stack ST.

The stack ST may include a first conductive layer 22, a switching layer 41, a second conductive layer 23, a first metal layer 31, a variable resistance layer 42, a second metal layer 32, and a third conductive layer 24 that are consequently stacked on each other in thickness direction of the substrate 100. In an exemplary embodiment, each of the above layers may be formed by at least one of a chemical vapor deposition process, a sputtering process, and/or an atomic layer deposition process. However, exemplary embodiments of the present inventive concepts are not limited thereto. The first to third conductive layers 22, 23, and 24 may be formed of or include a conductive material. For example, each of the first to third conductive layers 22, 23, and 24 may be a carbon-containing carbon electrode layer. In certain exemplary embodiments, the first to third conductive layers 22, 23, and 24 may be formed of or include at least one compound selected from metallic materials and metal nitrides.

One of the switching layer 41 and the variable resistance layer 42 may be used as a layer, in which switching devices will be formed by a patterning process to be described below, and the other may be used as a layer, in which variable resistance patterns will be formed by the patterning process. Hereinafter, the switching layer 41 and the variable resistance layer 42 will be described as the switching layer and the variable resistance layer, respectively. However, in some exemplary embodiments, the switching layer 41 and the variable resistance layer 42 may be used as the variable resistance layer and the switching layer, respectively.

The variable resistance layer 42 may be formed of or include at least one of materials with a data-storing property. For example, in an exemplary embodiment in which the variable resistance memory device is a phase-change memory device, the variable resistance layer 42 may be formed of or include a phase-changeable material having a crystalline structure that can be reversibly switched to one of crystalline and amorphous structures depending on its temperature. For example, in an exemplary embodiment, the variable resistance layer 42 may have a phase transition temperature of about 250° C. to about 350° C., where the phase transition temperature means a temperature, at which the crystalline structure of the variable resistance layer 42 is changed. In an exemplary embodiment, the variable resistance layer 42 may be formed of a compound that includes at least one of chalcogenide elements (e.g., Te and Sc) and at least one compound selected from, for example, Ge, Sb, Bi, Pb, Sn, Ag, As, S, Si, In, Ti, Ga, P, O, and C. For example, the variable resistance layer 42 may be formed of or include at least one compound selected from GeSbTe, GeTeAs, SbTeSe, GeTe, SbTe, SeTeSn, SbSeBi, GeBiTe, GeTeTi, InSe, GaTeSe, and InSbTe. However, exemplary embodiments of the present inventive concepts are not limited thereto. In certain exemplary embodiments, the variable resistance layer 42 may have a super lattice structure, in which a germanium-containing layer and a germanium-free layer are repeatedly stacked. For example, the variable resistance layer 42 may have a structure, in which GeTe and SbTe layers are repeatedly stacked.

In certain exemplary embodiments, the variable resistance layer 42 may include at east one compound selected from perovskite compounds and conductive metal oxides. For example, the variable resistance layer 42 may include at least one compound selected from niobium oxide, titanium oxide, nickel oxide, zirconium oxide, vanadium oxide, PCMO ((Pr,Ca)MnO$_3$), strontium-titanium oxide, barium-strontium-titanium oxide, strontium-zirconium oxide, barium-zirconium oxide, and barium-strontium-zirconium oxide. In an embodiment in which the variable resistance layer 42 includes at least one transition metal oxide, the variable resistance layer 42 may have a dielectric constant that is larger than a dielectric constant of a silicon oxide layer.

The switching layer 41 may be an ovonic threshold switch (OTS) layer having a bi-directional property. The switching layer 41 may have a phase transition temperature between crystalline and amorphous phases that is higher than the phase transition temperature of the variable resistance layer 42. For example, in an exemplary embodiment, the phase transition temperature of the switching layer 41 may range from about 350° C. to about 450° C. The switching layer 41 may be formed of a compound, which contains at least one of chalcogenide elements (e.g., Te and Se) and at least one compound selected from Ge, Sb, Bi, Al, Pb, Sn, Ag, As, S, Si, In, Ti, Ga, and P. The switching layer 41 may further contain a thermal stabilization element in addition toile compound. The thermal stabilization element may be at least one compound selected from C, N, and O. As an example, the switching layer 41 may be formed of or include at least one compound selected from AsTe, AsSe, GeTe, SnTe, GeSe, SnTe, SnSe, ZnTe, AsTeSe, AsTeGe, AsSeGe, AsTeGeSe, AsSeGeSi, AsSeGeC, AsTeGeSi, AsTeGeS, AsTeGeSiIn, AsTeGeSiP, AsTeGeSiSbS, AsTeGeSiSbP, AsTeGeSeSb, AsTeGeSeSi, AsTeGeSiSeNS, SeTeGeSi, GeSbTeSe GeBiTeSe, GeAsSbSe, GeAsBiTe, and GeAsBiSe.

The first and second metal layers 31 and 32 may be formed of or include at least one compound selected from W, Ti, Al, Cu, C, CN, TiN, TiAlN, TiSiN, TiCN, WN, CoSiN, WSiN, TaN TaCN, and TaSiN.

A mask layer 51 may be provided on the third conductive layer 24. For example, as shown in the exemplary embodiment of FIG. 5, a lower surface of the mask layer 51 may directly contact an upper surface of the third conductive layer 24. In an exemplary embodiment, the mask layer 51 may include at least one layer selected from a silicon nitride layer, a silicon carbide layer, and a silicon oxynitride layer.

Referring to the exemplary embodiment of FIG. 3, in block S2, the stack ST may be patterned to form memory cells MC and spacer structures SS. Hereinafter, a process of forming the memory cells MC and the spacer structures SS will be described in more detail.

Figure 6:
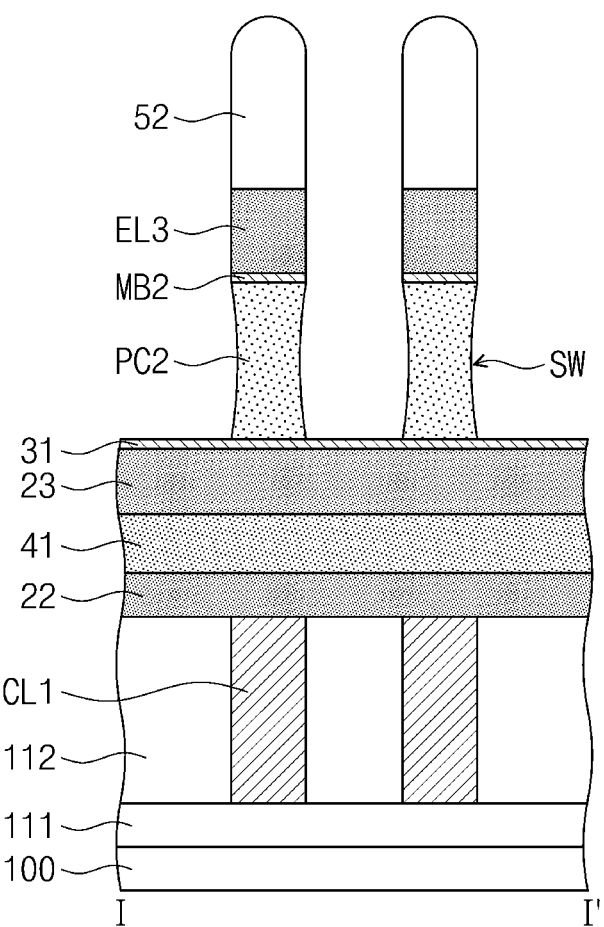
Figure 6:
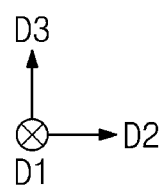

Referring to the exemplary embodiments of FIGS. 4 and 6, the mask layer 51 may be patterned to form mask patterns 52, and the third conductive layer 24, the second metal layer 32, and the variable resistance layer 42 may be sequentially patterned using the mask patterns 52 as an etch mask. As a result, variable resistance patterns PC2, second metal patterns MB2, and third electrodes EL3 may be sequentially formed on the first metal layer 31 (e.g., in a third direction D3 that is parallel to a thickness direction of the substrate 100). In an exemplary embodiment, the mask patterns 52 may be spaced apart from each other it a first direction D1 and a second direction D2 that are perpendicular to each other and the third direction D3 and are both parallel to an upper surface of the substrate 100. However, exemplary embodiments of the present inventive concepts are not limited thereto. For example, in another exemplary embodiment, the mask patterns 52 may be line-shaped patterns, which are extended in the first direction D1 and are spaced apart from each other in the second direction D2.

In an exemplary embodiment, the variable resistance patterns PC2, the second metal patterns MB2, and the third electrodes EL3 may be formed by an etching process having a highly anisotropic etching property. For example, the etching process may include an ion beam etching process and/or a reactive ion etching process.

Lateral side surfaces of the variable resistance patterns PC2 may be laterally etched to form recess regions SW. For example, as shown in the exemplary embodiment of FIG. 6, the variable resistance patterns PC2 may have concave lateral side surfaces due to the recess regions SW In an exemplary embodiment, the recess regions SW may be formed by a wet cleaning process using a cleaning solution, which is chosen to selectively etch the variable resistance patterns PC2. However, exemplary embodiments of the present inventive concepts are not limited thereto. For example, in other exemplary embodiments, the formation of the recess regions SW may be omitted.

Figure 7:
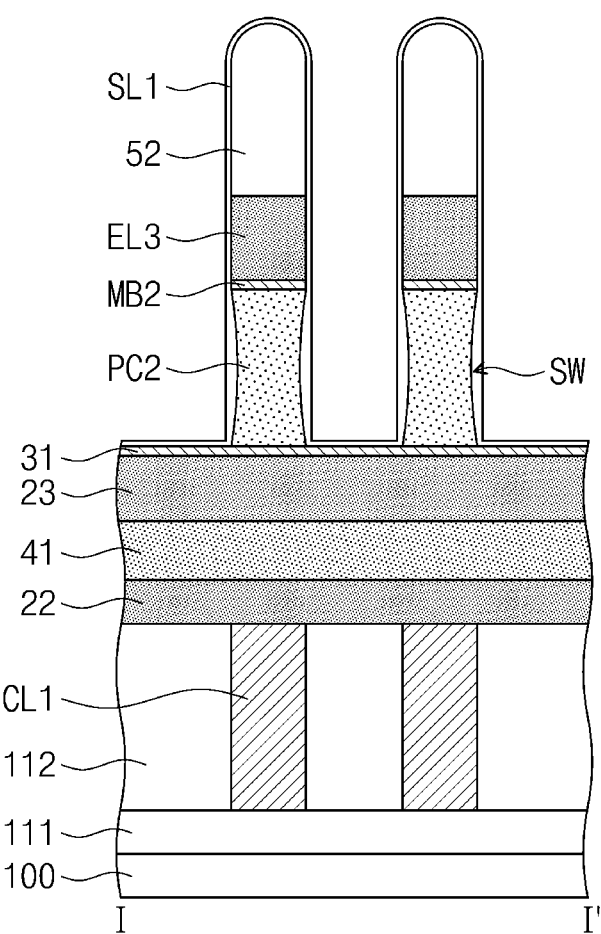

Referring to the exemplary embodiments of FIGS. 4 and 7, a first spacer layer SL1 may be formed to cover the resulting structure formed by the patterning process of the exemplary embodiment of FIG. 6. The first spacer layer SL1 may directly cover the lateral side surfaces of the variable resistance patterns PC2, the second metal patterns MB2, the third electrodes EL3 and the lateral side surfaces and top surfaces of the mask patterns 52. In addition, the first spacer layer SL1 may conformally cover a top surface of the first metal layer 31. In an exemplary embodiment, the first spacer layer SL1 may be formed of or include silicon oxide. The first spacer layer SL1 may be formed by an atomic layer deposition process and/or a chemical vapor deposition process. However, exemplary embodiments of the present inventive concepts are not limited thereto.

Figure 8:
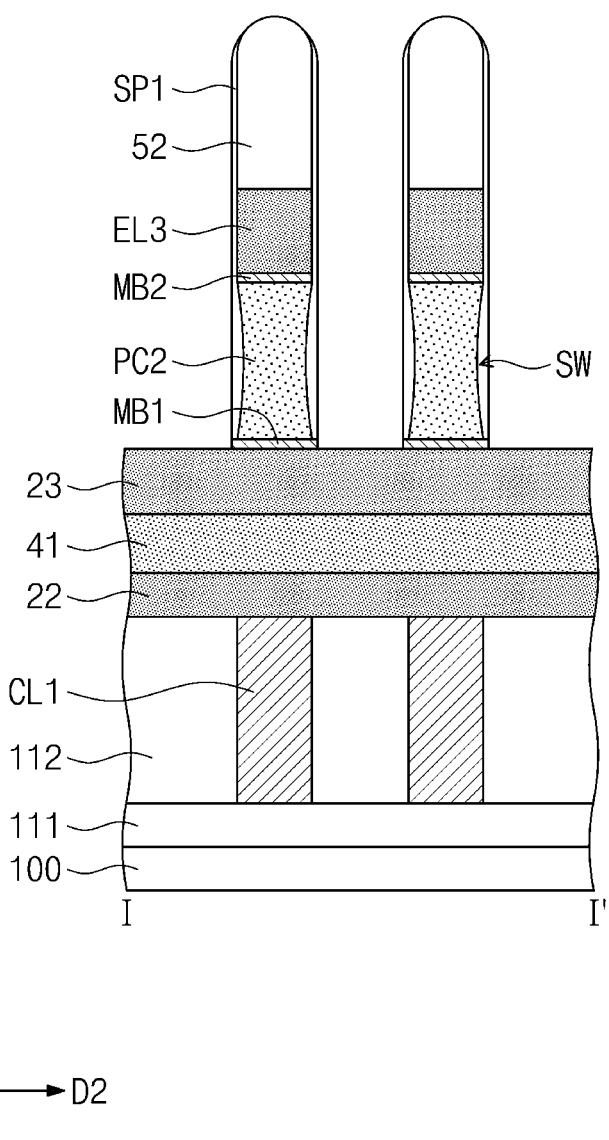

Referring to the exemplary embodiments of FIGS. 4 and 8, an etching process may be performed on the first spacer layer SL1 to form first spacers SP1. For example, in an exemplary embodiment, the etching process may include an ion beam etching process and/or a reactive ion etching process. During the formation of the first spacers SP1, the first metal layer 31 may be patterned to form first metal patterns MB1, which are spaced apart from each other (e.g., in the second direction D2) below respective variable resistance patterns PC2. The first spacers SP1 may be formed to expose top surfaces of the mask patterns 52.

Figure 9:
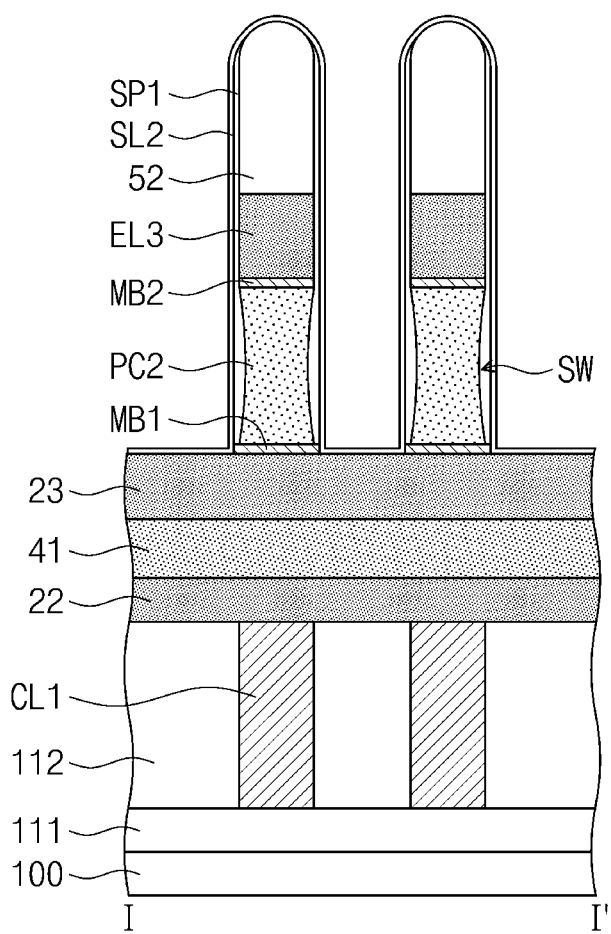

Referring to the exemplary embodiments of FIGS. 4 and 9, a second spacer layer SL2 may be formed to directly cover the first spacers SP1 and the exposed top surface of the mask patterns 52. The second spacer layer SL2 may directly cover exposed lateral side surfaces of the first metal patterns MB1. The second spacer layer SL2 may conformally cover a top surface of the second conductive layer 23. In an exemplary embodiment, the second spacer layer SL2 may be formed of or include at least one compound selected from silicon nitride, silicon oxide, and silicon oxynitride. The second spacer layer SL2 may be formed of or include a material that is different from the first spacer layer SL1. In an exemplary embodiment, the second spacer layer SL2 may be formed by an atomic layer deposition process and/or a chemical vapor deposition process. However, exemplary embodiments of the present inventive concepts are not limited thereto.

Figure 10:
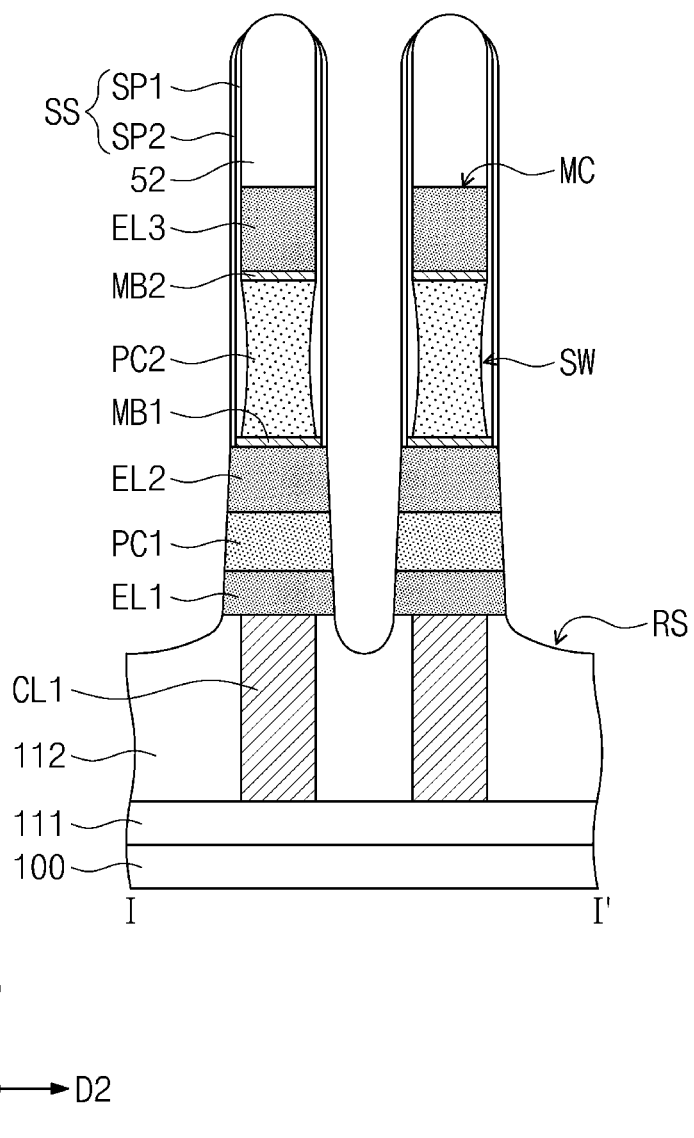

Referring to the exemplary embodiments of FIGS. 4 and 10, an etching process may be performed on the second spacer layer SL2 to form second spacers SP2. Bottom surfaces of the second spacers SP2 may be in direct contact with a top surface of the second conductive layer 23. As a result, spacer structures SS including the first spacer SP1 and the second spacer SP2 may be formed.

The second conductive layer 23, the switching layer 41, and the first conductive layer 22 may be sequentially etched using the mask patterns 52 as an etch mask to form second electrodes EL2 from the second conductive layer 23, switching devices PC1 from the switching layer 41, and first electrodes EL1 from the first conductive layer 22. In an exemplary embodiment, the etching process may be performed concurrently with the process of forming the second spacers SP2. As an example, the etching process may include an ion beam etching process and/or reactive ion etching process. However, exemplary embodiments of the present inventive concepts are not limited thereto. As shown in the exemplary embodiment of FIG. 10, during the etching process, recess portions RS may be formed in an upper portion of the second interlayered insulating layer 112. The recess portions RS may have bottom surfaces that have a lower height (e.g., distance from an upper surface of the substrate 100 in the third direction D3) than the height of bottom surfaces of the first electrodes EL1. As a result of the etching process, memory cells MC, each of which includes a first electrode EL1, a switching device PC1, a second electrode EL2, a first metal pattern MB1, a variable resistance pattern PC2, a second metal pattern MB2, and a third electrode EL3, may be formed.

In the afore-described structure of the memory cells MC, the variable resistance pattern PC2 is described as being sequentially stacked on the switching device PC1 so that the variable resistance pattern PC2 is above the switching device PC1. However, exemplary embodiments of the present inventive concepts are not limited thereto and the positions of the switching device PC1 and the variable resistance pattern PC2 may be exchanged. For example, the variable resistance pattern PC2 may be disposed between the first electrode EL1 and second electrode EL2 and the switching device PC1 may be disposed thereabove between the first metal pattern MB1 and second metal pattern MB2.

Figure 11:
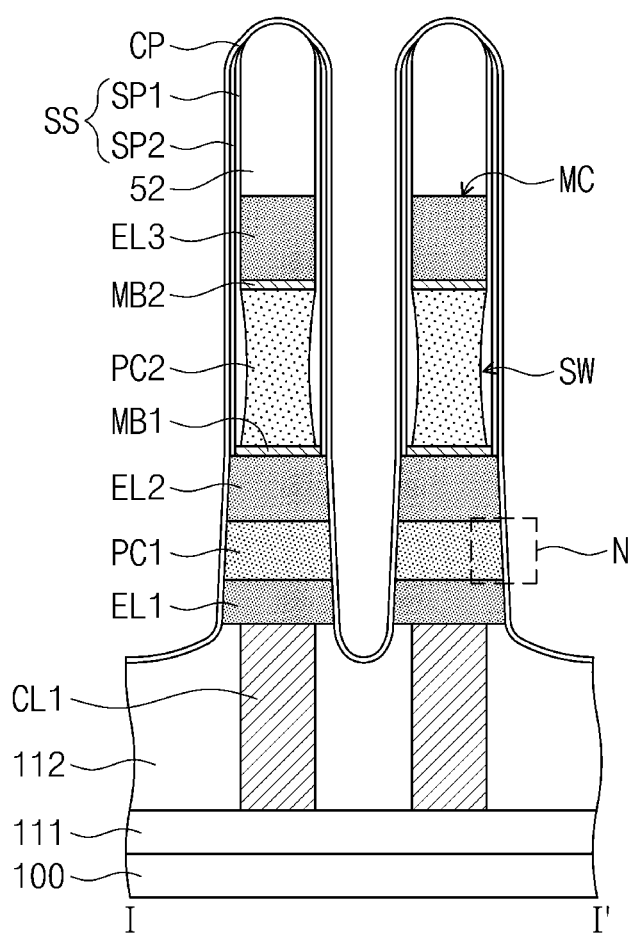

Referring to the exemplary embodiments of FIGS. 3, 4, and 11, in block S3, a capping structure CP may be formed to cover lateral side surfaces of the memory cells MC and an exposed top surface of the mask pattern 52. The lateral side surfaces of the memory cells MC may be covered in common with the capping structure CP. For example, the capping structure. CP may commonly cover the spacer structures SS on each memory cell MC of the plurality of memory cells. The capping structure CP may cover the recess portions RS formed in the upper portion of the second interlayered insulating layer 112. The process of framing the capping structure CP will be described in more detail with reference to the exemplary embodiments of FIGS. 13 to 22.

Figure 12:
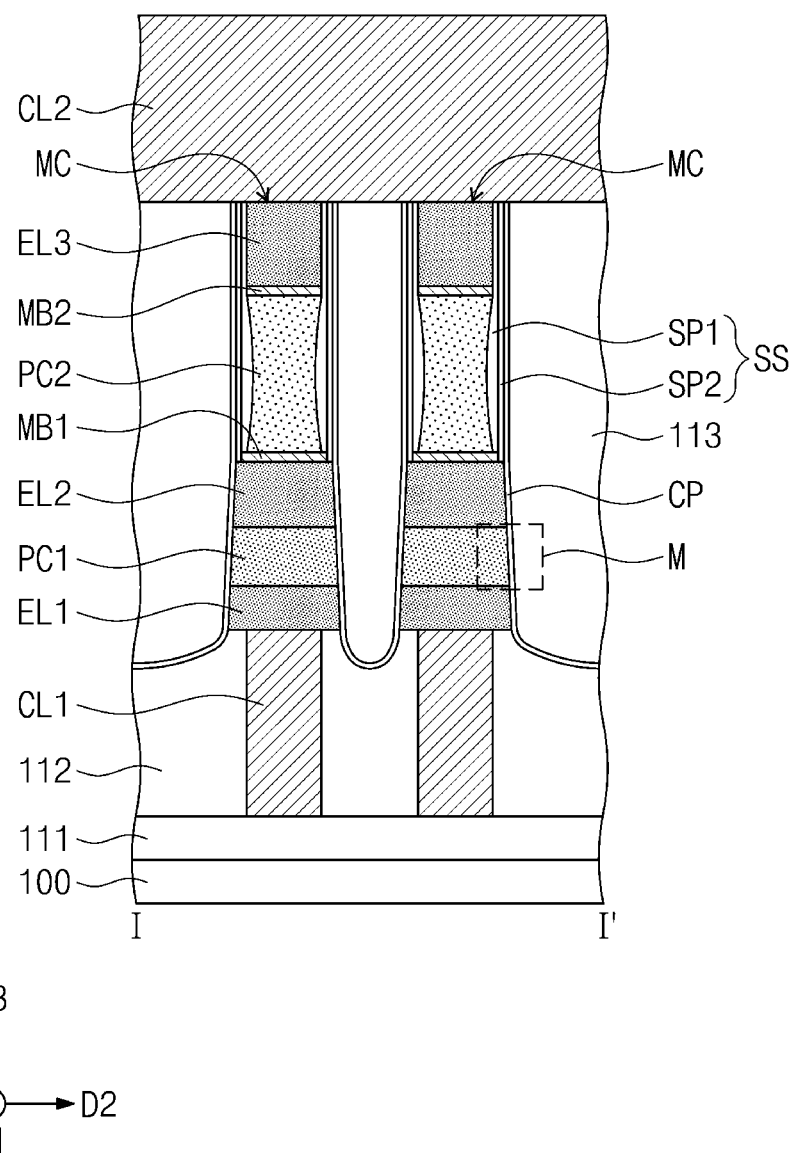

Referring to the exemplary embodiments of FIGS. 3, 4, and 12, in block S4, an insulating gapfill layer 113 may be formed to fill gap regions between adjacent memory cells MC of the plurality of memory cells MC. In an exemplary embodiment, the insulating gapfill layer 113 may be formed by a amiable chemical vapor deposition (FCVD) process. The insulating gapfill layer 113 may include a low-k dielectric layer. For example, in an exemplary embodiment, the insulating gapfill layer 113 may be formed of or include at least one compound selected from silicon oxycarbide, silicon oxycarbonitride, and silicon carbonitride. Thereafter, a planarization process May be performed to remove the mask patterns 52 and to expose upper surfaces of the third electrodes EL3.

In an exemplary embodiment in which the mask patterns 52 are line-shaped patterns extending in the first direction D1 and are spaced apart from each other in the second direction D2, an additional patterning process may be performed. For example, the additional patterning process may be performed to separate the memory cells MC from each other in the first direction D1. The additional patterning process may be substantially the same as the processes described with reference to the exemplary embodiments of FIGS. 5 to 12. In contrast, in an exemplary embodiment in which the mask patterns 52 are spaced apart from each other in both the first and second directions D1 and D2, the additional patterning process may not be performed.

Second conductive lines CL2 may be formed on the third electrodes EL3. For example, as shown in the exemplary embodiment of FIG. 12, a lower surface of the third electrodes EL3 may directly contact upper surfaces of the third electrodes EL3 and the insulating gapfill layer 113. Each of the second conductive lines CL2 may be extended in the second direction D2 and may be connected to a plurality of the third electrodes EL3. In an exemplary embodiment, the formation of the second conductive lines CL2 may include forming a conductive layer on the third electrodes EL3 and patterning the conductive layer. Thereafter, an interlayered insulating layer may be formed to fill a region between the second conductive lines CL2.

Figure 13:
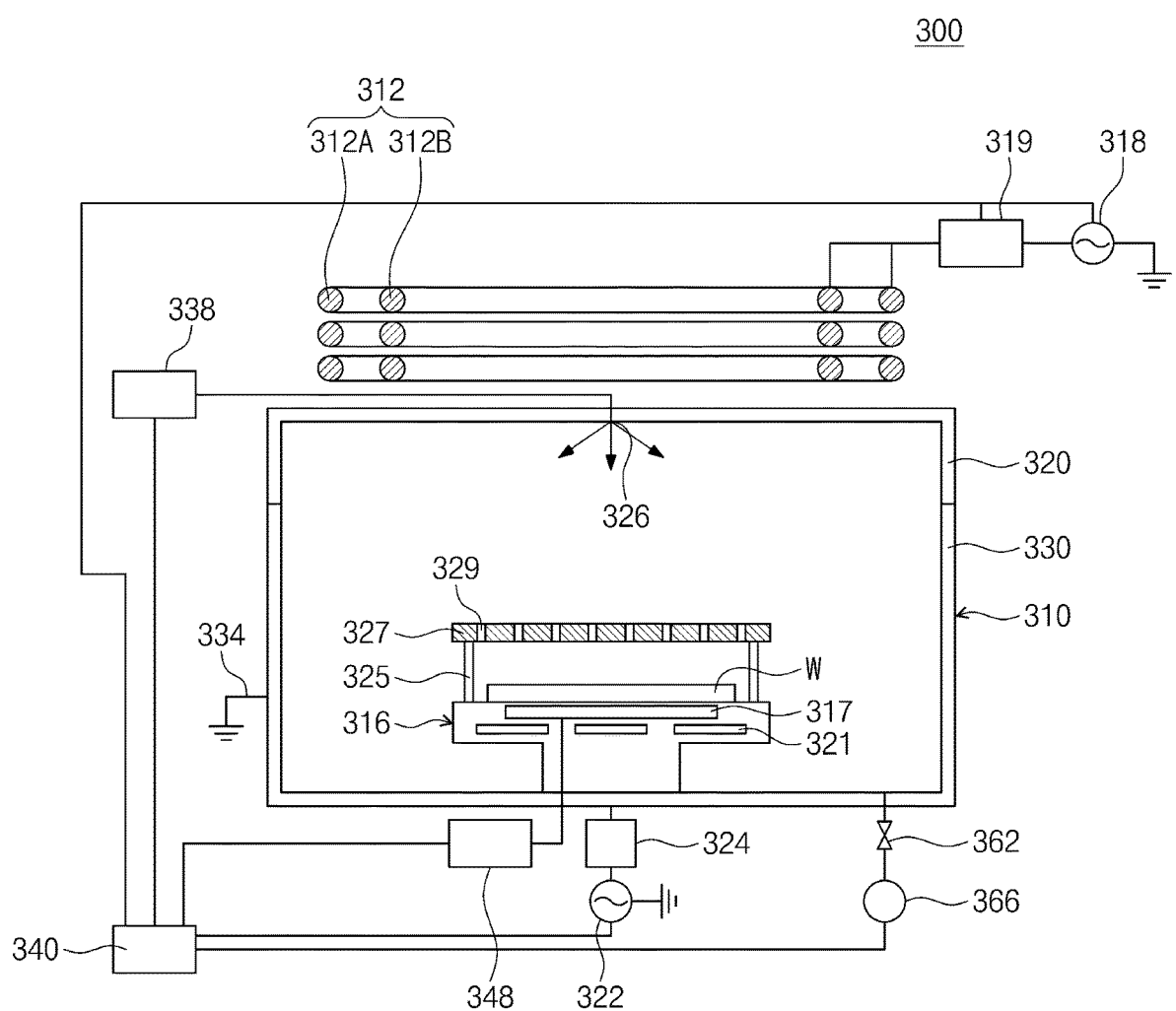
FIG. 13 is a conceptual diagram of a decoupled plasma system, which is used to form at least a portion of a capping structure, according to an exemplary embodiment of the present inventive concepts.

FIG. 13 is a conceptual diagram illustrating a decoupled plasma system 300, which is used to form at least a portion of the capping structure CP, according to an exemplary embodiment of the present inventive concepts.

The decoupled plasma system 300 may include a process chamber 310 with a conductive body 330 and a dielectric ceiling 320 disposed above the conductive body 330. The conductive body 330 may be connected to a ground 334. At least one induction coil antenna 312 may be disposed on the dielectric ceiling 320. As shown in the exemplary embodiment of FIG. 13, the induction coil antenna 312 may include an external coil 312A and an internal coil 312B. The induction coil antenna 312 may be connected to an RF power 318 through a second matcher network 319. In an exemplary embodiment, the RF power 318 may generate continuous or pulsed plasma, using a tunable frequency ranging from about 2 MHz to about 13.56 MHz. The RF power 318 and the second matcher network 319 may be connected to a controller 340.

A substrate supporter 316 may be provided in the process chamber 310 to support a wafer W. The substrate supporter 316 may be connected to a biasing power 322 through a first matcher network 324. The biasing power may be connected to the controller 340. In an exemplary embodiment, the biasing power 322 may generate continuous or pulsed power, using a frequency of about 13.56 MHz. In certain exemplary embodiments, the biasing power 322 may be a DC power source or a pulsed DC power source. However, exemplary embodiments of the present inventive concepts are not limited thereto.

The substrate supporter 316 may include a chucking device 317. A resistive heater 321 may be provided below the chucking device 317. A heat transfer gas source 348 may be connected to the chucking device 317. The heat transfer gas source 348 may facilitate the heat transfer process between the substrate supporter 316 and the wafer W.

An ion-radical shield 327 may be provided on the substrate supporter 316. The ion-radical shield 327 may include a plurality of spaced apart apertures 329. A density of ions supplied to the wafer W may be dependent on sizes and arrangement of the apertures 329 of the ion-radical shield 327. In an exemplary embodiment, the ion-radical shield 327 may be formed of or include quartz. The ion-radical shield 327 may be supported by legs 325.

A gas panel 338 may be provided to supply process gases into the process chamber 310. The gas panel 338 may supply process gases into the process chamber 310 through an inlet port 326, which is formed in the dielectric ceiling 320. The gas panel 338 may be connected to the controller 340. A throttle valve 362 and a vacuum pump 366 may be further provided to control an internal pressure of the process chamber 310.

Figure 14:
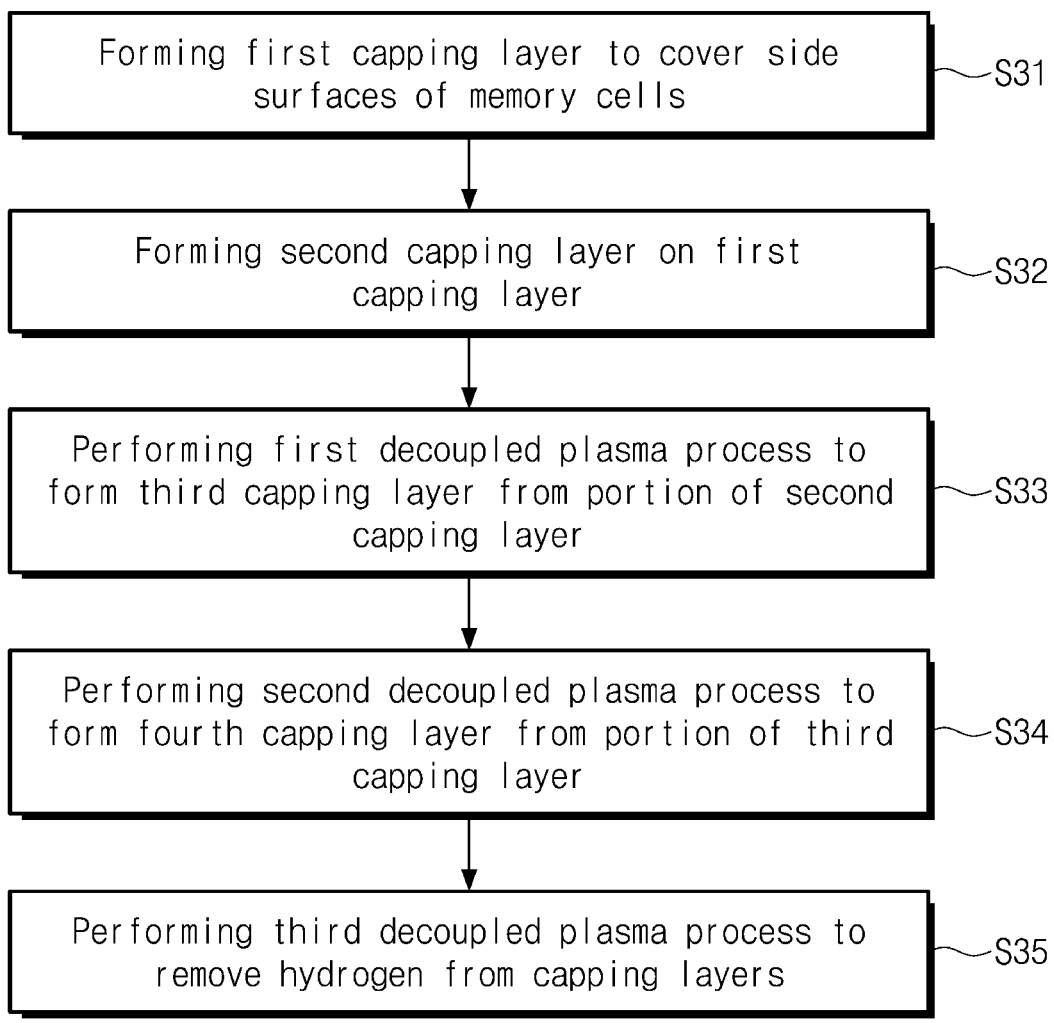
FIG. 14 is a process flow chart of a method of fabricating a capping structure, according to an exemplary embodiment of the present inventive concepts.
Figure 15:
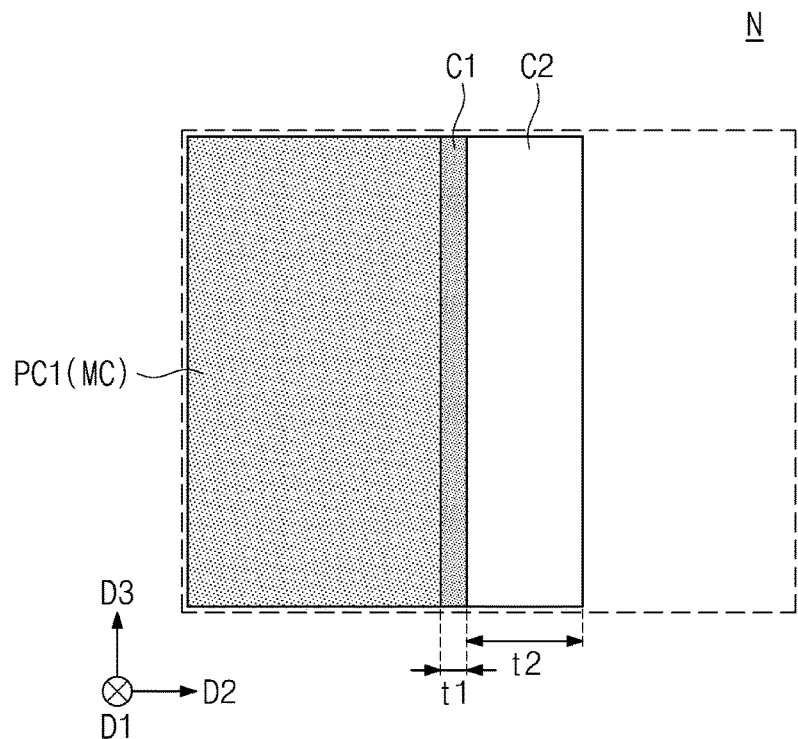
FIG. 15 is an enlarged cross-sectional view illustrating a region N of FIG. 11 according to an exemplary embodiment of the present inventive concepts.
Figure 16:
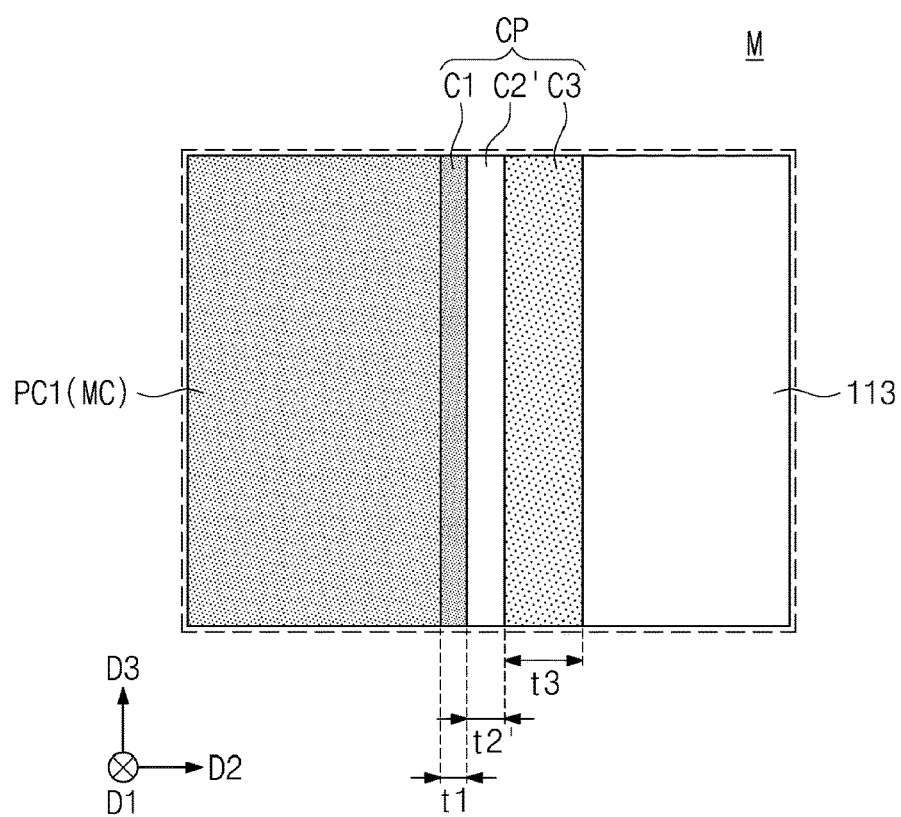
FIGS. 16 and 17 are enlarged cross-sectional views illustrating a region M of FIG. 12 according to exemplary embodiments of the present inventive concepts.
Figure 17:
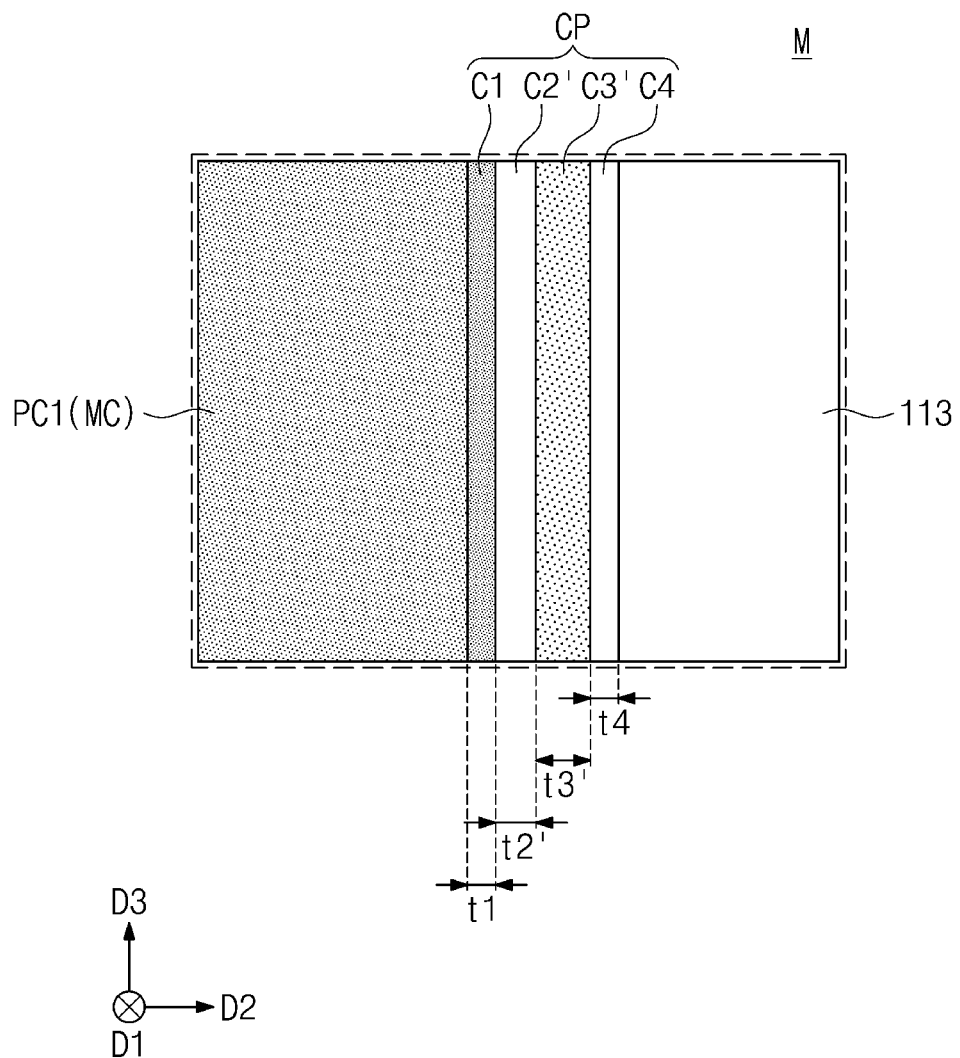

FIG. 14 is a process flow chart illustrating a method of fabricating the capping structure CP according to an exemplary embodiment of the present inventive concepts. FIG. 15 is an enlarged cross-sectional view illustrating a region N of FIG. 11. FIGS. 16 and 17 are enlarged cross-sectional views illustrating a region M of FIG. 12 according to exemplary embodiments of the present inventive concepts.

Referring to the exemplary embodiments of FIGS. 14 and 15, in block S31, a first capping layer C1 may be formed to cover lateral side surfaces of memory cells MC. FIG. 15 illustrates only a portion of the first capping layer C1 near a switching device PC1. However, the first capping layer C1 may cover the entire lateral side surface of each of the memory cells MC. For example, as shown in the exemplary embodiment of FIG. 12, the capping layer CP may directly contact a lateral side surface of the second spacers SP2 on the lateral side surface of the variable resistance pattern PC2. In an exemplary embodiment, the first capping layer C1 may be formed of or include silicon nitride. The first capping layer C1 may be formed by an atomic layer deposition process. However exemplary embodiments of the present inventive concepts are not limited thereto. In an exemplary embodiment, the deposition process of the first capping layer C1 may be performed at a temperature in a range of about 230° C. to about 350° C. The deposition process of the first capping layer C1 may be performed for about 10 minutes to about 20 minutes. However, exemplary embodiments of the present inventive concepts are not limited thereto.

A second capping layer C2 may be formed on the first capping layer C1. In an exemplary embodiment, the second capping layer C2 may be formed of or include silicon oxide. The second capping layer C2 may be formed by an atomic layer deposition process. A thickness t2 of the second capping layer C2 (e.g., length in the second direction D2) may be greater than a thickness t1 of the first capping layer C1. For example, in an exemplary embodiment; the thickness C1 of the first capping layer C1 may range from about 5 Å to about 20 Å. The thickness t2 of the second capping layer C2 may range from about 20 Å to about 80 Å.

Referring to the exemplary embodiments of FIGS. 13 to 16, in block S33, a first decoupled plasma process may be performed to form a third capping layer C3 from a portion of the second capping layer C2. For example, the first decoupled plasma process may be performed in the decoupled plasma system 300 described with reference to the exemplary embodiment of FIG. 13.

The first decoupled plasma process may be a decoupled plasma nitridation process. As a result of the first decoupled plasma process, a portion of the second capping layer C2 may be transformed to the third capping layer C1. For example, at least a partial portion of the second capping layer C2 corresponding to at least 50% of the thickness t2 of the exemplary embodiment of FIG. 15 may be transformed to the third capping layer C3 by the first decoupled plasma process. However, exemplary embodiments are not limited thereto and in other exemplary embodiments a partial portion of the second capping layer C2 that is less than 50% of the thickness t2 may be transformed to the third capping layer C3.

In an exemplary embodiment, the third capping layer C3 may be formed of or include silicon oxynitride. A content of nitrogen atoms in the third capping layer C3 may be lower than its stoichiometric ratio. A content of nitrogen atoms in the third capping layer C3 may be lower than a content of oxygen atoms in the third capping layer C3. For example, a content ratio of oxygen atoms to nitrogen atoms in the third capping layer C3 may range from about 1:0.5 to about 1:0.8.

In the third capping layer C3, a ratio of oxygen to nitrogen may be constant. However, exemplary embodiments of the present inventive concepts are not limited thereto. For example, in an alternative exemplary embodiment, a portion of the third capping layer C3 that is closer to the first capping layer C1 may have a lower nitrogen concentration than portions of the third capping layer C3 that are farther from the first capping layer C1. In this exemplary embodiment, a nitrogen concentration of the capping layer C1 may be continuously increased with increasing distance from the first capping layer C1.

A sum of a thickness t2' of a second capping layer C2' after the first decoupled plasma process and a thickness t3 of the third capping layer C3, may be substantially equal to the thickness t2 of the second capping layer C2 measured before the first decoupled plasma process. In an exemplary embodiment, the thickness t3 of the third capping layer C3 may be greater than the thickness t2' of the second capping layer C2' after the first decoupled plasma process. The thickness t2' of the second capping layer C2' after the first decoupled plasma process may range from about 15 Å to about 30 Å. The thickness t3 of the third capping layer C3 may range from about 20 Å to about 45 Å.

The first decoupled plasma process may be performed in the process chamber 310 of the exemplary embodiment of FIG. 13. The first decoupled plasma process may include supplying process gases into the process chamber 310 through the gas panel 338. The process gases may include an inert gas and at least one compound selected from $NH_3$ and $N_2$ gases. As an example, the inert gas may include argon or helium. As an example, a flow rate of the $NH_3$ gas may range from 0 sccm to about 300 sccm, a flow rate of the $N_2$ gas may range from 0 sccm to about 1000 sccm. A flow rate of the helium gas may range from 0 sccm to about 1000 sccm, and a flow rate of the argon gas may range from about 100 sccm to about 2000 sccm.

The first decoupled plasma process may be performed at a relatively low pressure (e.g., a pressure that is lower than the pressure in the processes for forming the first and second capping layers C1 and C2). For example, in an exemplary embodiment, the first decoupled plasma process may be performed at a pressure of about 1 mTorr to about 50 mTorr. The pressure in the first decoupled plasma process may be controlled by the throttle valve 362 and the vacuum pump 366. In an exemplary embodiment, the first decoupled plasma process may be performed at a temperature of about 25° C. to about 300° C. The first decoupled plasma process may be performed for a process time, that is shorter than the process time for forming the first capping layer C1. For example, in an exemplary embodiment, the first decoupled plasma process may be performed for about 30 seconds to about 5 minutes. The power of the biasing power 322 in the first decoupled plasma process may range from about 100W to about 300W. The first decoupled plasma process may be performed to have a duty cycle of about 20% to about 80%.

After the first decoupled plasma process, the third decoupled plasma process, which will be described in more detail below, may be performed to form the capping structure CP including the first capping layer C1, the second capping layer C2' after the first decoupled plasma process, and the third capping layer C3. Thereafter, the process of forming the insulating gapfill layer 113 described with reference to the exemplary embodiments of FIGS. 3 and 12 may be performed to bring the insulating gapfill layer 113 into contact with the third capping layer C3 as shown in the exemplary embodiment of FIG. 16. In certain exemplary embodiments, a second decoupled plasma process may be performed after the first decoupled plasma process and before the third decoupled plasma process. Hereinafter, the second decoupled plasma process and the third decoupled plasma process will be described in more detail.

Referring to the exemplary embodiments of FIGS. 13, 14, and 17, in block S34, the second decoupled plasma process may be performed to form a fourth capping layer C4 from a portion of the third capping layer C3. The second decoupled plasma process may be performed in an in-situ manner. For example, the second decoupled plasma process may be performed in the decoupled plasma system 300 described with reference to the exemplary embodiment of FIG. 13 after the first decoupled plasma process is performed. In an exemplary embodiment, the fourth capping layer C4 may be formed of or include silicon oxide.

The second decoupled plasma process may be a decoupled plasma oxidation process. As a result of the second decoupled plasma process, at least a partial portion of the third capping layer C3 may be transformed to a fourth capping layer C4. In an exemplary embodiment, a partial portion of the third capping layer C3, which corresponds to about 10% to about 50% of its thickness t3, may be transformed to the fourth capping layer C4. However, exemplary embodiments of the present inventive concepts are not limited thereto.

A sum of a thickness t3' of a third capping layer C3' after the second decoupled plasma process and a thickness t4 of the fourth capping layer C4 may be substantially equal to the thickness t3 of the third capping layer C3 before the second decoupled plasma process. The thickness t4 (e.g., length in the second direction D2) of the fourth capping layer C4 may be less than the thickness t3' of the third capping layer C3' after the second decoupled plasma process. In an exemplary embodiment, the thickness t3' of the third capping layer C3' after the second decoupled plasma process may range from about 15 Å to about 40 Å. The thickness t4 of the fourth capping layer C4 may range from about 10 Å to about 25 Å.

The second decoupled plasma process may be performed in the process chamber 310 of the exemplary embodiment of FIG. 13. The second decoupled plasma process may include supplying process gases into the process chamber 310 through the gas panel 338. The process gases may contain an $O_2$ gas and an inert gas. As an example, the inert gas may include argon or helium. In an exemplary embodiment, a flow rate of the O2 gas may range from 0 sccm to about 1000 sccm. A flow rate of the helium gas may range from 0 sccm to about 1000 sccm, and a flow rate of the argon gas may range from about 100 sccm to about 2000 sccm.

Other process conditions, such as temperature, pressure, and process time, in the second decoupled plasma process may be the same as the conditions in the first decoupled plasma process described above.

In block S35, a third decoupled plasma process may be performed to remove hydrogen from the capping layers. The third decoupled plasma process may be a plasma thermal treatment. For example, the third decoupled plasma process may be performed after the second decoupled plasma process to remove hydrogen atoms or hydrogen ions from the first capping layer C1, the second capping layer C2' after the first decoupled plasma process, the third capping layer C3' after the second decoupled plasma process, and the fourth capping layer C4. The third decoupled plasma process may be performed in an in-situ manner. For example, the third decoupled plasma process may be performed in the decoupled plasma system 300 described with reference to the exemplary embodiment of FIG. 13 after the second decoupled plasma process is performed.

The third decoupled plasma process gray include supplying a process gas into the process chamber 310 through the gas panel 338. In an exemplary embodiment, the process gas may contain only an inert gas, without a reaction gas, such as a gas that contains an oxygen source or a nitrogen source. For example, the process gas of the third decoupled plasma process may contain only helium (He). Other process conditions, such as temperature, pressure, and process time, in the third decoupled plasma process may be the same as the conditions in the first decoupled plasma process described above.

As a result of the third decoupled plasma process, the capping structure CP including the first capping layer C1, the second capping layer C2' after the first decoupled plasma process, the third capping layer C3' after the second decoupled plasma process, and the fourth capping layer C4 may be formed. In an exemplary embodiment, the first capping layer C1 may be a silicon nitride layer, the second capping layer C2' after the first decoupled plasma process may be a silicon oxide layer, the third capping layer C3' after the second decoupled plasma process may be a silicon oxynitride layer, and the fourth capping layer C4 may be a silicon oxide layer. A process of forming an insulating gapfill layer 113 may then be performed in the same manner as that described with reference to the exemplary embodiments of FIGS. 3 and 12.

In the case where content ratios of elements constituting the switching device PC1 and/or the variable resistance pattern PC2 are changed, electric characteristics of the switching device PC1 and/or the variable resistance pattern PC2 may be deteriorated or a cell-to-cell variation in electrical characteristics of memory cells may be increased. The deterioration and cell-to-cell variation of electric characteristics in memory cells may result from by-products, which are produced in a subsequent process.

As an example, oxygen ions or oxygen atoms may be originated from an oxygen source, which is used in a process of forming the insulating gapfill layer 113. Here, the oxygen ions oxygen atoms may be moved onto lateral side surfaces of the switching device PC1 or the variable resistance pattern PC2, thereby resulting in the oxidation of a material (e.g., germanium (Ge)) constituting the switching device PC1 or the variable resistance pattern PC2. This damage of the switching device PC1 or the variable resistance pattern PC2 may be accelerated as the process temperature or the process time is increased.

In the formation of the capping structure CP according to an exemplary embodiment of the present inventive concepts, the length of time for the formation of the first capping layer C1, which is formed at a high temperature with a relatively low deposition rate, may be minimized and the third capping layer C3 may be formed by nitriding at least a portion of the second capping layer C2 within a short time. Therefore, a process time of a high temperature process may be reduced to prevent the switching device PC1 or the variable resistance pattern PC2 from being damaged. In the capping structure CP according to an exemplary embodiment of the present inventive concepts, hydrogen atoms or ions may be removed by the third decoupled plasma process. Accordingly, it may be possible to remove unnecessary bonds in the capping structure CP caused by the hydrogen atoms or ions and to increase a ratio of silicon-nitrogen bonds and/or silicon-oxygen bonds. This may make it possible to improve the material characteristics of the capping structure CP and to more efficiently prevent the switching device PC1 or the variable resistance pattern PC2 from being damaged.

Figure 18:
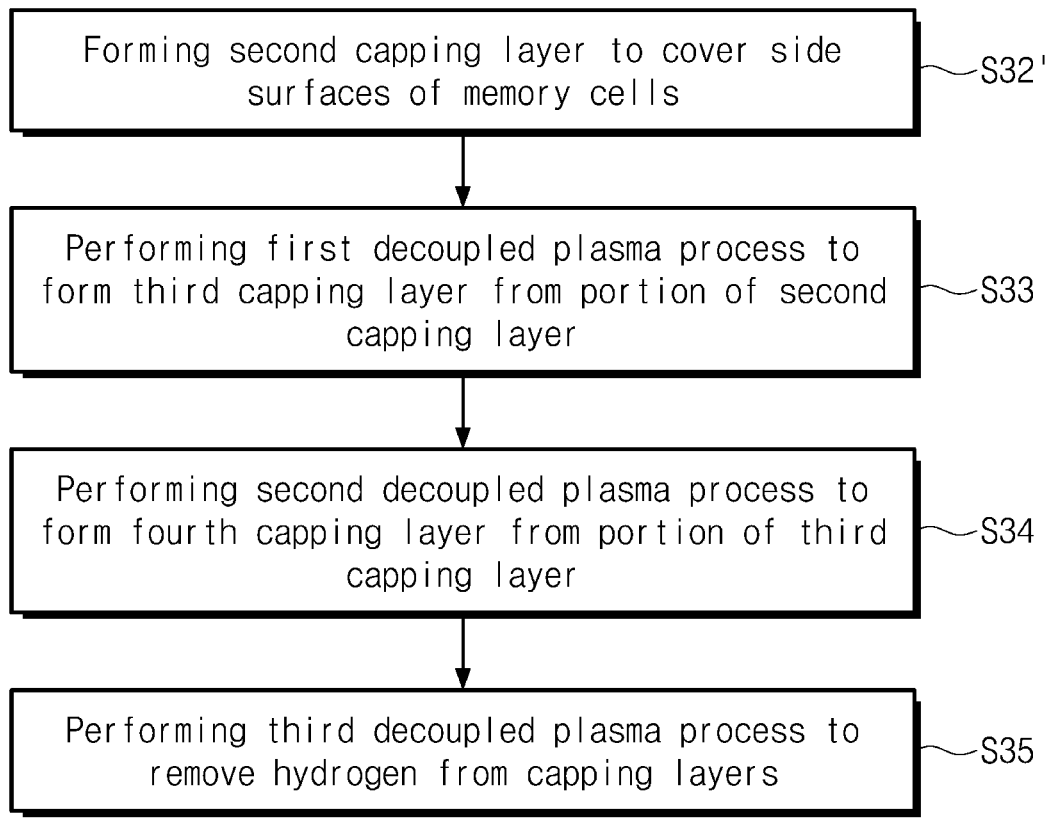
FIG. 18 is a process flow chart of a method of fabricating a capping structure according to an exemplary embodiment of the present inventive concepts.
Figure 19:
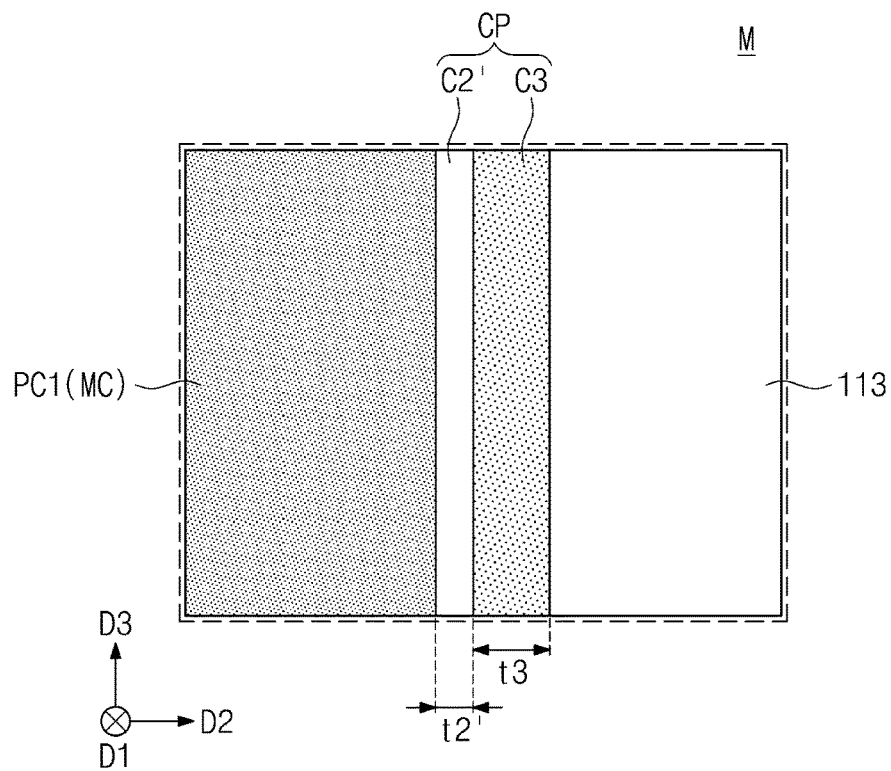
FIGS. 19 and 20 are enlarged cross-sectional views illustrating a region M of FIG. 12 according to exemplary embodiments of the present inventive concepts.
Figure 20:
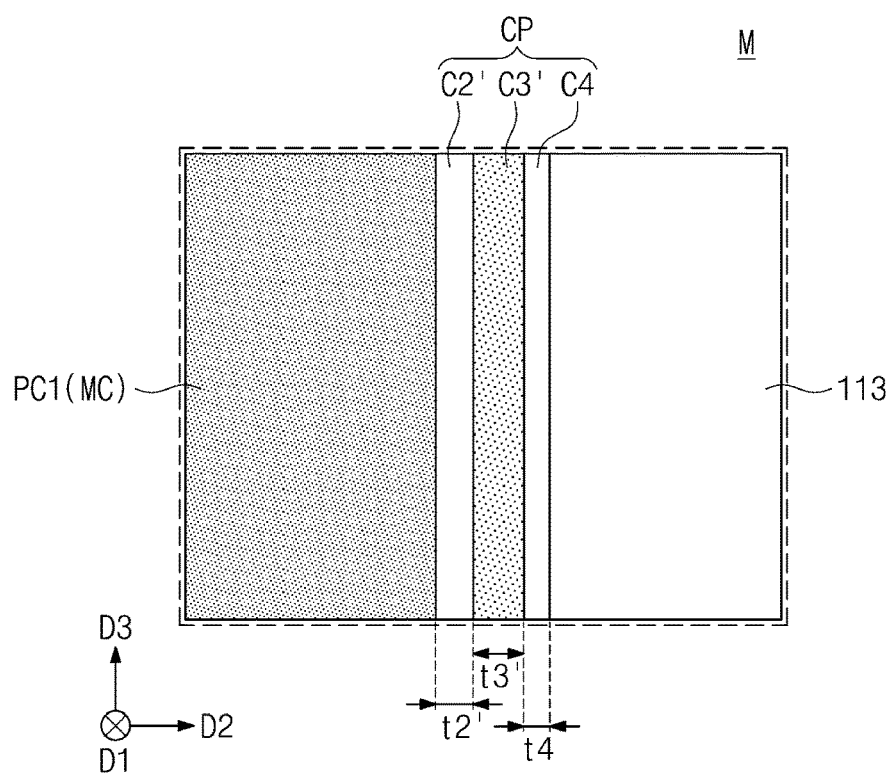

FIG. 18 is a process flow chart illustrating a method of fabricating the capping structure CP, according to an exemplary embodiment of the present inventive concepts. FIGS. 19 and 20 are enlarged cross-sectional views illustrating a region M of the exemplary embodiment of FIG. 12. For concise description, a previously described element may be identified by the same reference number without repeating an overlapping description thereof.

In the present exemplary embodiment, the formation of the first capping layer C1 may be omitted, and a second capping layer C2 may be formed to cover side surfaces of memory cells MC (in S32'). In other words, the second capping layer C2 may be formed to contact the lateral side surfaces of the memory cells MC. Thereafter, the processes S33, S34, and S35 described with reference to FIG. 14 may be performed to form the capping structure CP shown in the exemplary embodiment of FIG. 20. A process of forming an insulating gapfill layer 113 may then be performed in the same manner as that described with reference to the exemplary embodiments of FIGS. 3 and 12.

Referring to the exemplary embodiment of FIG. 20, the capping structure CP may include a second capping layer C2' formed after the first decoupled plasma process, a third capping layer C3' formed after the second decoupled plasma process, and a fourth capping layer C4. The second capping layer C2' may be in direct contact with a lateral side surface of the switching device PC1. The fourth capping layer C4 may be in direct contact with the insulating gapfill layer 113. The third capping layer C3' after the second decoupled plasma process may have a thickness t3' (e.g., length in the second direction DR2), which is greater than a thickness t2' of the second capping layer C2' after the first decoupled plasma process.

In certain exemplary embodiments, the second decoupled plasma process S34 may be omitted. Referring to the exemplary embodiment of FIG. 19, the third decoupled plasma process may be performed on the third capping layer C3, without the second decoupled plasma process, and then, the insulating gapfill layer 113 may be formed.

Figure 21:
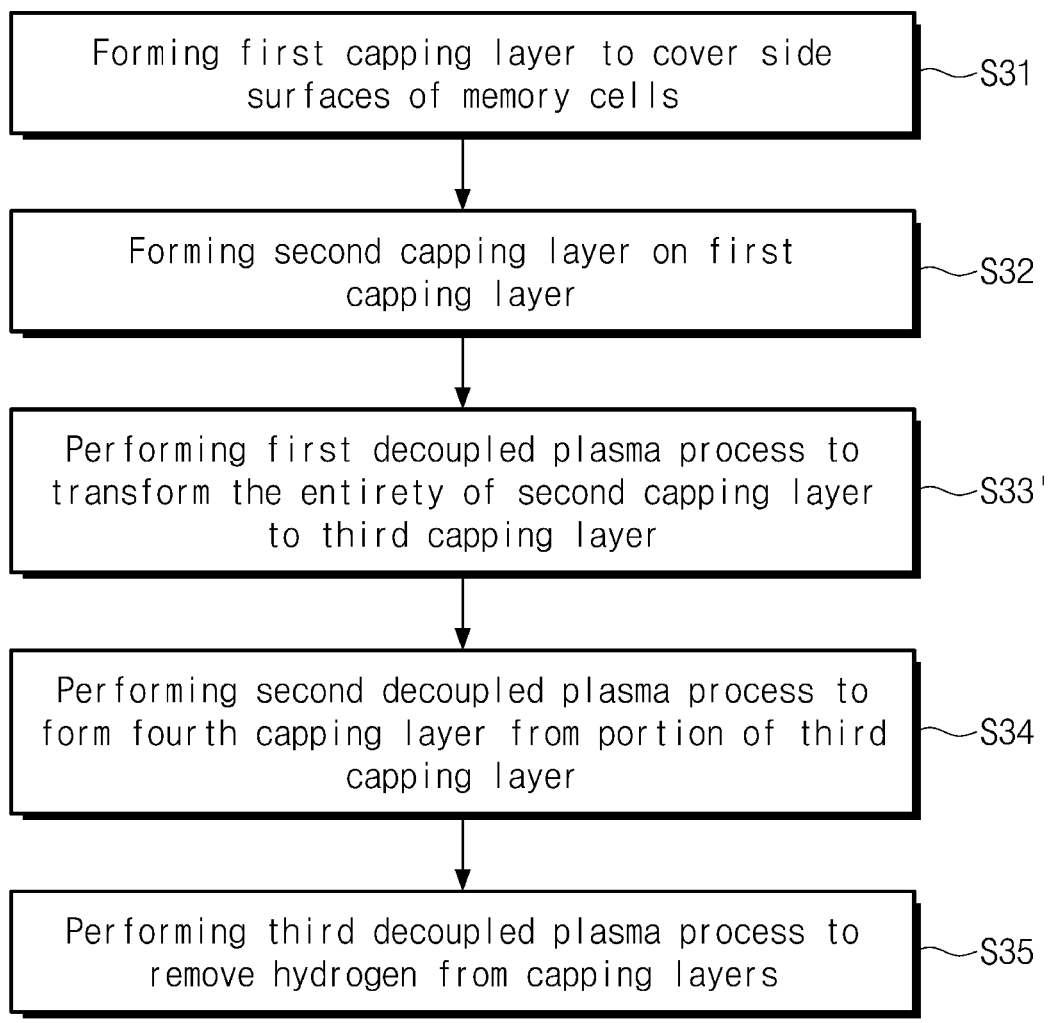
FIG. 21 is a process flow chart of a method of fabricating a capping structure, according to an exemplary embodiment of the present inventive concepts.
Figure 22:
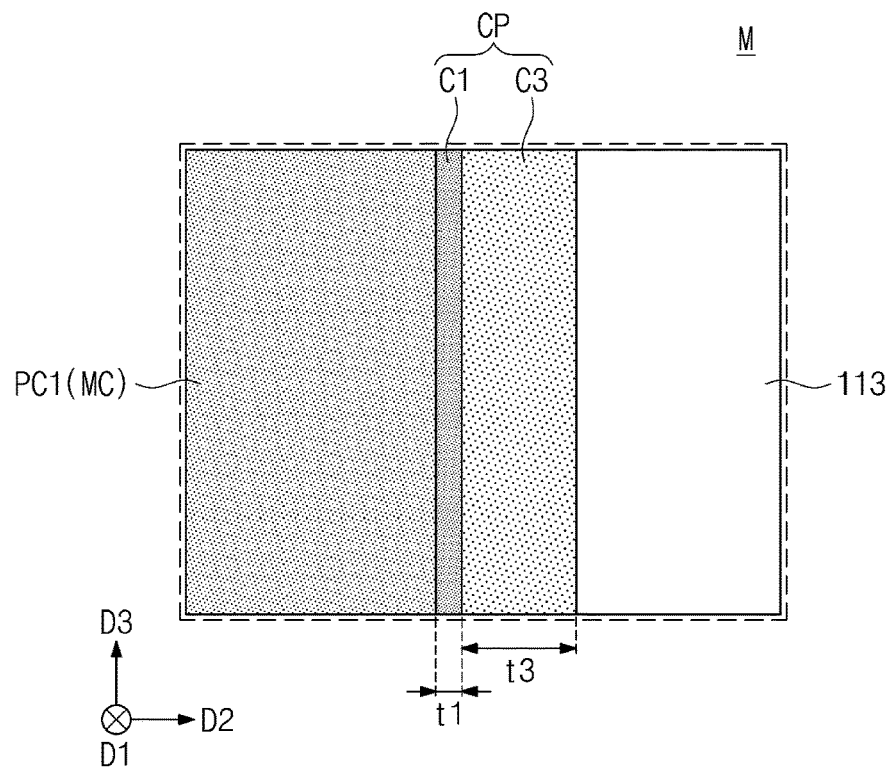
FIGS. 22 and 23 are enlarged cross-sectional views illustrating a region M of FIG. 12 according to exemplary embodiments of the present inventive concepts.
Figure 23:
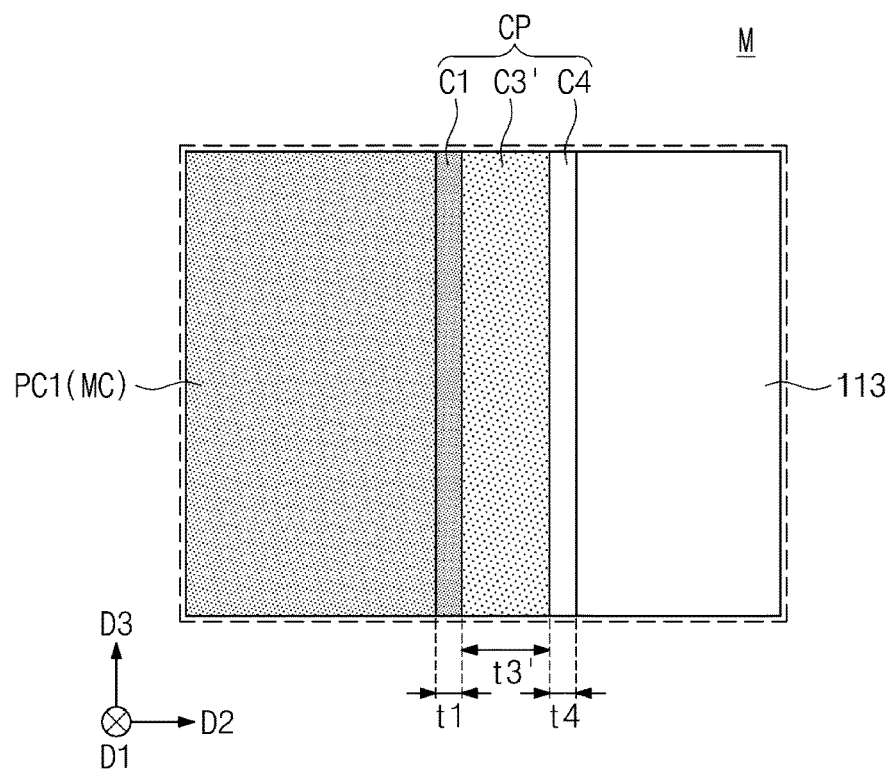

FIG. 21 is a process flow chart illustrating a method of fabricating the capping structure CP, according to an exemplary embodiment of the present inventive concepts. FIGS. 22 and 23 are enlarged cross-sectional views illustrating a region M of the exemplary embodiment of FIG. 12. For concise description, a previously described element may be identified by the same reference number without repeating an overlapping description thereof.

Referring to the exemplary embodiments of FIGS. 21 to 23, in blocks S31 and S32 the first capping layer C1 and the second capping layer C2 may be sequentially formed on the lateral side surfaces of the memory cells MC. In block S33' a first decoupled plasma process may be performed to transform the entirety of the second capping layer C2 to a third capping layer C3. After the first decoupled plasma process, the second capping layer C2 may not remain and the first capping layer C1 may be in direct contact with the third capping layer C3. A thickness t3 (e.g., length in the second direction D2) of the third capping layer C3 may be greater than a thickness t1 of the first capping layer C1. In block S34 a second decoupled plasma process may then be performed to form a fourth capping layer C4 from a portion of the third capping layer C3. The thickness t3' of the third capping layer C3' after the second decoupled plasma process is finished may be greater than the thickness t1 of the first capping layer C1. In block S35, a third decoupled plasma process may then be performed, and a process of forming as insulating gapfill layer 113 may be performed in the same manner as described with reference to the exemplary embodiments of FIGS. 3 and 12.

Referring to the exemplary embodiment of FIG. 23, the capping structure CP may include a first capping layer C1, a third capping layer C3' after the second decoupled plasma process, and a fourth capping layer C4. The first capping layer C1 may be in direct contact with a lateral side surface of the switching device PC1. The fourth capping layer C4 may be in direct contact with the insulating gapfill layer 113.

Alternatively, the second decoupled plasma process S34 may be omitted. Referring to the exemplary embodiment of FIG. 22, the third decoupled plasma process may be performed on the third capping layer C3 without performing the second decoupled plasma process, and then, the insulating gapfill layer 113 may be formed.

In a method of fabricating a variable resistance memory device according to an exemplary embodiment of the present inventive concepts, phase-change patterns are prevented from being damaged by a subsequent process and a process time of a high temperature process is reduced.

In a method of fabricating a variable resistance memory device according to an exemplary embodiment of the present inventive concepts, it may be possible to prevent phase-change patterns from being damaged by a subsequent process and to reduce a process time of a high temperature process.

While exemplary embodiments of the present inventive concepts have been particularly shown and described, it will be understood by one of ordinary skill in the art that variations in form and detail may be made therein without departing from the spirit and scope of the attached claims.

What is claimed is:

1. A method of fabricating a variable resistance memory device, comprising:
   forming a plurality of memory cells on a substrate, each of the plurality of memory cells including a switching device and a variable resistance pattern;
   forming a capping structure that commonly covers lateral side snakes of the plurality of memory cells; and
   forming an insulating gapfill layer that covers the capping structure and fills a region between adjacent memory cells of the plurality of memory cells,
   wherein the forming of the capping structure comprises:
   forming a second capping layer including silicon oxide that covers the lateral side surfaces of the plurality of memory cells; and
   nitriding at least a partial portion of the second capping layer by performing a first decoupled plasma process to form a third capping layer that includes silicon oxynitride.

2. The method of claim 1, wherein the first decoupled plasma process transforms at least 50% of a first thickness of the second capping layer to the third capping layer.

3. The method of claim 2, wherein the second capping layer has a second thickness after the first decoupled plasma process in a range of about 15 Å to about 35 Å; and
   a thickness of the third capping layer formed by the first decoupled plasma process is in a range of about 20 Å to about 45 Å.

4. The method of claim 1, wherein the first decoupled plasma process transforms an entirety of the second capping layer to the third capping layer.

5. The method of claim 1, further comprising:
forming a first capping layer that covers the lateral side surfaces of the plurality of memory cells prior to forming the second capping layer,
wherein the first capping layer comprises silicon nitride.

6. The method of claim 5, wherein a thickness of the first capping layer is less than a first thickness of the second capping layer prior to the performing of the first decoupled plasma process.

7. The method of claim 1, wherein the first decoupled plasma process is performed using a process gas comprising at least one compound selected from $NH_3$ and $N_2$.

8. The method of claim 1, further comprising oxidizing at least a partial portion of the third capping layer by performing a second decoupled plasma process to form a fourth capping layer including silicon oxide.

9. The method of claim 8, wherein the second decoupled plasma process is performed using a process gas comprising $O_2$.

10. The method of claim 1, further comprising:
performing a third decoupled plasma process using a process gas including helium after the first decoupled plasma process is performed,
wherein the process gas for the third decoupled plasma process does not include an oxygen source or a nitrogen source.

11. The method of claim 1, wherein:
the insulating gapfill layer includes silicon oxycarbide, and
the insulating gapfill layer is formed by a flowable chemical vapor deposition.

12. The method of claim 1, wherein the first decoupled plasma process is performed at a temperature of about 25° C. to about 300'C.

13. A method of fabricating a variable resistance memory device, comprising:
forming a plurality of memory cells on a substrate, each of the plurality of memory cells including a switching device and a variable resistance pattern;
forming a capping structure that commonly covers lateral side surfaces of the plurality of memory cells; and
forming an insulating gapfill layer that covers the capping structure and fills a region between adjacent memory cells of the plurality of memory cells,
wherein the forming of the capping structure comprises:
forming a first capping layer including silicon nitride that covers the lateral side surfaces of the plurality of memory cells;
forming a second capping layer on the first capping layer;
nitriding at least a partial portion of the second capping layer by performing a first decoupled plasma process to form a third capping layer including silicon oxynitride; and
performing a third decoupled plasma process using a process gas including helium, after the first decoupled plasma process is performed.

14. The method of claim 13, wherein:
the first decoupled plasma process is performed using a process gas comprising at least one compound selected from $NH_3$ and $N_2$; and
the third decoupled plasma process is performed using a process gas that does not contain an oxygen source or a nitrogen source.

15. The method of claim 13, wherein the first decoupled plasma process transforms at least 50% of a first thickness of the second capping layer to the third capping layer.

16. The method of claim 13, wherein a thickness of the first capping layer is less than a first thickness of the second capping layer prior to the performing of the first decoupled plasma process.

17. The method of claim 13, further comprising nitriding at least a partial portion of the third capping layer through a second decoupled plasma process to form a fourth capping layer that includes silicon oxide.

18. The method of claim 17, wherein the first to third decoupled plasma processes are performed in a same process chamber.

19. The method of claim 13, wherein the first decoupled plasma process is performed for a time period in a range of about 30 seconds to about 5 minutes.

20. The method of claim 13, wherein the first decoupled plasma process is performed at a pressure in a range of about 3 mTorr to about 50 mTorr.

* * * * *